United States Patent [19]

Chaure et al.

[11] 4,385,393
[45] May 24, 1983

[54] ADAPTIVE PREDICTION DIFFERENTIAL PCM-TYPE TRANSMISSION APPARATUS AND PROCESS WITH SHAPING OF THE QUANTIZATION NOISE

[75] Inventors: Christian Chaure, Lezardrieux; Albert Benveniste, Rennes; Andre Gilloire, Lannion, all of France

[73] Assignee: L'Etat Francais represente par le Secretaire d'Etat, Issy les Moulineaux, France

[21] Appl. No.: 253,159

[22] Filed: Apr. 10, 1981

[30] Foreign Application Priority Data

Apr. 21, 1980 [FR] France ................................. 80 08884

[51] Int. Cl.³ ........................................... H04B 12/04
[52] U.S. Cl. .................................... 375/30; 332/11 D; 375/26
[58] Field of Search ........................ 332/11 R, 11 D; 179/15.55 R; 358/135, 136, 260; 364/825, 852, 854, 857; 340/347 AD; 375/27, 30, 31, 32, 99, 103, 26; 320/118

[56] References Cited

U.S. PATENT DOCUMENTS

4,141,034 2/1979 Netralavi et al. ........................ 375/27
4,319,082 3/1982 Gilloire et al. ................ 179/15.55 R Primary Examiner—Benedict V. Safourek
Attorney, Agent, or Firm—Pearne, Gordon, Sessions, McCoy, Granger & Tilberry

[57] ABSTRACT

A coding process for the adaptive prediction differential PCM type. An error signal $e_t$ is formed between a sample of signal $y_t$ to be coded and a prediction signal $\bar{p}_t$ of said signal. The prediction signal $\bar{p}_t$ is formed from restored signals $\bar{y}_t$ and $\bar{e}_t$ by two linear filtering operations, the first relating to N successive samples of $\bar{y}_t$ and using coefficients $A1_t, A2_t, \ldots, AN_t$ and the second relating to P successive samples of $\bar{e}_t$ and using coefficients $B1_t, B2_t, \ldots, BP_t$, the coefficients $A1_t, A2_t, \ldots, AN_t$ and $B1_t, B2_t, \ldots, BP_t$ being sequentially adjusted at each time t so that the mean power of error signal $\bar{e}_t$ is minimal. Instead of carrying out the prediction on the basis of signals $\bar{y}_t$ and $\bar{e}_t$ only according to the invention, use is also made of the real signal $y_t$ and the real error $e_t$. A linear filtering of $y_t$ using the coefficients $A1_t, A2_t, \ldots, AN_t$, these coefficients affecting N successive samples of the signal $y_t$, a linear filtering of $e_t$ using the coefficients $B1_t, B2_t, \ldots, BP_t$ are performed. In addition, the quantities thus obtained are respectively weighted by two coefficients between 0 and 1 and not simultaneously zero.

4 Claims, 19 Drawing Figures

ADAPTIVE PREDICTION DIFFERENTIAL PCM-TYPE TRANSMISSION APPARATUS AND PROCESS WITH SHAPING OF THE QUANTIZATION NOISE

BACKGROUND OF THE INVENTION

The present invention relates to an adaptive prediction differential PCM-type transmission process and apparatus with shaping of the quantization noise and which is used in telecommunications, particularly in telephony.

The PCM procedure (pulse code modulation) is widely used in the field of telecommunications and in particular in telephone transmissions. In this procedure on transmission, the signal to be transmitted is sampled, the samples obtained quantized, the quantized signals are coded in digital form and the coded signals transmitted, whilst on reception the signals received are decoded and the original signal restored.

An improvement to this procedure is obtained by replacing the quantization of the input signal by quantizing the difference between said signal and a prediction signal obtained from the formation of this difference. The prediction signal is supplied by a prediction circuit or predictor. This system is called differential PCM or DPCM for short.

Another improvement is obtained by multiplying the difference signal by a gain factor in order to utilize in an optimum manner the available levels of the quantizer. The quantizer signal is then divided by the same factor for restoring the original quantized sample.

In a differential PCM system, the prediction circuit is generally constituted by a linear filter which, on the basis of a sample sequence preceding the sample to be processed is able to provide a prediction relative to this sample.

Such a prediction filter can be fixed once and for all and in this case its characteristics are chosen so that it is adapted to the mean longterm spectrum of the signal to be transmitted. However, such a filter does not make it possible to obtain a very good transmission quality. The latter can be improved on adapting the prediction filter to the developments of the signal by periodically updating its characteristics.

This adaptation can be carried out sequentially or recursively by correcting at each sampling moment the characteristics of the filter as a function of the value taken by the difference signal at this moment. The adaptation criterion is that the average power of the difference signal (which is to some extent an error signal) is as low as possible.

This type of coding, called "adaptive prediction differential PCM" (or ADPCM for short) apply to the telephone speech signal and has already been described in a number of articles. The following articles provide a survey of this and describe certain adaptive quantization processes:

"Digital Coding of Speech Waveforms: PCM, DPCM and DM quantizers," by N. S. JAYANT, published in the U.S. Journal "Proceedings of IEEE," May 1974;

"Adaptive predictive coding of speech signals" by B. S. ATAL and M. R. SCHROEDER, published in the U.S. Journal "B.S.T.J.," Vol.49, October 1970;

"Speech Coding" by J. L. FLANAGAN, M. SCHROEDER, B. ATAL R. CROCHIERE, N. S. JAYANT, J. M. TRIBOLET, published in the U.S. Journal IEEE-COM 27, No.4, April 1979;

"Bit rate reduction by automatic adaptation of quantizer step size in DPCM systems" by P. CASTELLINO, G. MODENA, L. NEBBIA and C. SCAGLIOLA, published in the reports of the International Seminar on digital transmissions, Zurich 1974;

"A robust adaptive quantizer" by D. J. GOODMAN and R. M. WILKINSON, published in the U.S. Journal IEEE Transactions on Communications, November 1975.

Systems using these general principles are briefly described by means of FIGS. 1 and 2. The circuit of FIG. 1 is a coding circuit and that of FIG. 2 a decoding circuit.

The ADPCM code of FIG. 1 comprises an algebraic subtracter 1 with two inputs, the first receiving the signal to be coded $y_t$ and the second a prediction signal $\bar{p}_t$. The output of this subtracter supplies a difference or error signal $e_t$, which is applied to the input of an arithmetic unit 2 controlled by a signal $\bar{e}_{t-1}$. The output of arithmetic unit 2 supplies a signal $en_t$ which is applied to the input of a coding circuit 3. The output of this coder supplies a coded signal $c_t$, which is applied on the one hand to a transmission channel and on the other to the input of a decoding—quantizing circuit 4. The latter supplies a signal $\overline{en}_t$, which is applied to the input of an arithmetic unit 5, controlled by signal $\bar{e}_{t-1}$. The output of this unit supplies a signal $\bar{e}_t$, which is a restored error signal, which is applied to a first input of an adaptive prediction circuit 8, to the first input of an algebraic adder 7 and finally to the input of a register 6 controlled in reading by pulses from a clock H. This register supplies a delayed signal $\bar{e}_{t-1}$, which is applied to the control inputs of circuits 2 and 5. The output of the adaptive prediction circuit 8 supplies the signal $\bar{p}_t$, applied on the one hand to the second input of subtracting circuit 1 and on the other hand to the second input of adding circuit 7, whose output supplies a restored signal $\bar{y}_t$, which is applied to a second input of circuit 8.

In the illustrated embodiment, speech signal $y_t$ is assumed to be applied to the input in digital form, e.g. in the form of a 12 bit linearized code supplied by the decompression of the standard PCM code (the coder and linearizer are not shown).

The system of circuits 2, 3, 4, 5, 6 constitutes an embodiment of a conventional adaptive quantizer, circuits 2 and 5 respectively having the functions of standardizing to a fixed value the power of error signal $e_t$ and restoring the true power to the quantized standardized signal $\overline{en}_t$ in order to obtain the quantized error signal $\bar{e}_t$.

The function of register 6 is to make the value of signal $\bar{e}_{t-1}$ used for control purposes available at the desired time.

The ADPCM decoder of FIG. 2 comprises a decoding—quantizing circuit 4, whose input receives signal $c_t$ from the transmission channel and whose output supplies a signal $\overline{en}_t$, which is applied to the input of an arithmetic unit 5, controlled by a signal $\bar{e}_{t-1}$. The output of this unit supplies a signal $\bar{e}_t$, which is applied to a first input of an adaptive prediction circuit 8, to a first input of an algebraic adder 7 and finally to the input of a register 6 controlled in reading by a clock H, the output of said register being connected to the control input of circuit 5. The output of the adaptive prediction circuit 8 supplies a prediction signal $\bar{p}_t$, which is applied to a second input of algebraic adder 7, whose output supplies a signal $\bar{y}_t$. This signal is applied to a second input of circuit 8 and constitutes at the same time the output signal of the decoder, i.e. in definitive terms the transmitted signal corresponding to the input signal $y_t$ applied to the coder.

Circuits 4, 5, 6, 7 and 8 of this decoder are identical to the circuits with the same references of the coder of FIG. 1.

The present invention relates solely to the prediction circuit 8, whilst the other components can be of a per se known type.

In the field of the digital transmission of a telephone speech signal, compared with the standardized system operating at 64 kbit/s it is intended to pass to a lower bit rate of 32 kbit/s. Equipment making possible this reduction in the bit rate have been constructed in accordance with the aforementioned and known ADPCM process with a relatively good quality of the restored speech signal. However, for this application it is advantageous to further improve the quality obtained by a more complex coding. For other applications, it may be advantageous to reduce the rate to the minimum possible value in accordance with differential coding processes, whilst retaining a given quality:

A large amount of research has been carried out on adaptive predictors in this connection and they have followed two fundamental directions, as indicated below:

(1) Design of more complex filters or the use of very high performance adaptive algorithms (recursive algorithms of the high-speed Kalman filter type or of the adaptive lattice filter type). Examples of work in this connection are provided by the following articles:

J. D. MARKEL and A. H. GRAY: "On correlation equation as applied to speech analysis" published in the U.S. Journal IEEE-Audio-Electroacoustic, AU-21, No.2 1973.

J. MAKHOUL: "A class of all-zero lattice digital filters; properties and applications," published in the U.S. Journal IEEE-ASPP 26, No.4 1978.

D. L. COHN and James L. MELSA: "The residual encoder—An improved ADPCM system for speech digitization," published in the Journal IEEE transactions on communications, September 1975.

T. W. CAIRNS, W. A. COBERLY, D. F. FINDLEY: "ARMA modeling applied to linear prediction of speech," published in the Journal IEEE-ASSP, July 1978.

C. SCAGLIOLA: "Automatic vocal tract parameter estimation by an iterative algorithm," published in the Italian Journal CSELT Rapporti tecnici, No.2, June 1975, pp.19 to 24.

(2) Shaping the quantization noise by prefiltering in accordance with the following principle: in conventional ADPCM coding, the quantization noise spectrum is in a first approximation roughly flat, which sometimes has the effect of making it clearly perceptible in the frequency ranges where the speech signal to be coded has a low power. Therefore, various devices have been designed in connection with coding by blocks with a medium and low bit rate (below 16 kbit/s) for shaping the quantization noise spectrum so as to eliminate this disadvantage. Such devices are described in the following articles:

M. BEROUTI and J. MAKHOUL: "High quality adaptative prediction coding of speech," published in IEEE-ASSP, TULSA 1978.

J. MAKHOUL, M. BEROUTI: "Adaptive noise spectral shaping and entropy coding in predictive coding of speech," published in IEEE Transactions on ASSP, February 1979.

B. S. ATAL, M. R. SCHROEDER: "predictive coding of speech signals and subjective error criteria," published in IEEE Transactions on ASSP, June 1979.

These articles describe a procedure in which coding takes place by sample blocks and in the first two articles the prefilter is obtained by reversing the prediction filter, which is difficult to perform. Reference can also be made to the following articles:

J. MENEZ, D. MAUDUIT: "Systeme de codage du signal de parole par decomposition spectrale" (Speech signal coding system by spectral decomposition), National Conference of Signal Processing and its applications, April 1977.

J. E. STJERNVALL: "On rate and frequency allocation in subband of gaussian sources," Department of electrical engineering, Linköping University SWEDEN.

These articles describe a procedure using subband analysis followed by coding in each band.

Like these earlier studies, the present invention is directed at the improvement of ADPCM coding equipment, particularly for high bit rates. It achieves this objective by means of an adaptive prediction circuit permitting an appropriate shaping of the quantization noise.

Prior to the definition of the invention, it is advantageous to define the terminology used. As in the description of the prior art provided hereinbefore, the restored signals on the basis of which the prediction is made, are in the form of a symbol surmounted by a bar, i.e. $\bar{y}_t$ for the signal and $\bar{e}_t$ for the quantized error, t indicating the processing time or the rank of the processed sample.

The quantization noise on the signal at the time t is called $\Delta y_t$. It is equal to the difference between the restored signal $\bar{y}_t$ and the incident signal $y_t$. In the same way, the quantization noise on the prediction error is called $\Delta e_t$ and, at the same time t, it is equal to the difference between the restored error $\bar{e}_t$ and the true error commited $e_t$. Thus, we obtain by definition:

$$\Delta y_t = \bar{y}_t - y_t \qquad (1)$$

$$\Delta e_t = \bar{e}_t - e_t \qquad (2)$$

As stated hereinbefore, the quantization noise $\Delta e_t$ on the prediction error generally has an almost flat spectrum. The shaping of the quantization noise $\Delta y_t$ on the signal, which is the objective of the invention, consists of giving this noise a spectrum which is substantially of the same shape as the spectrum of signal $y_t$, it then being stated that the spectra having been made "parallel". In this way, in the ranges where the signal $y_t$ is weak, the quantization noise is also weak and in the ranges where $y_t$ is strong, the noise assumes relatively high values without this being prejudicial to the transmission quality.

According to the invention, this shaping of the quantization noise is carried out within the scope of a prediction procedure by linear filter with recursive readjustment and not within the scope of a coding system by sample blocks, whereof a first disadvantage has been referred to hereinbefore and whereof a second disadvantage is the necessity of transmitting to the receiver the coefficients of the prediction filter calculated in the transmitter, in addition to the quantized error signal. This point will now be discussed in greater detail to facilitate the understanding of the invention.

In an adaptive prediction system with recursive readjustment the restored signal $\bar{y}_t$ is equal to the sum of the predicted signal $\bar{p}_t$ and the restored error $\bar{e}_t$ (cf FIG. 1):

$$\bar{y}_t = \bar{p}_t + \bar{e}_t \tag{3}$$

The predicted signal can be obtained by a linear operation of form:

$$\bar{P}_{t+1} = \sum_{k=1}^{N} Ak_t \bar{y}_{t-k+1} \tag{4}$$

which is equivalent to a filtering operation. Thus, N coefficients $A1_t, A2_t \ldots AN_t$ are obtained which effect N samples, which are samples of the restored signal, namely: $\bar{y}_t, \bar{y}_{t-1}, \ldots, \bar{y}_{t-N+1}$. We obtain from (3) and (4):

$$\bar{y}_{t+1} = \sum_{k=1}^{N} Ak_t \bar{y}_{t-k+1} + \bar{e}_{t+1} \tag{5}$$

On writing the equation (5) in the form of a "z" transform (where the variable z is equal to $e^{jT}$, T being the sampling period), we obtain between $\bar{y}_t$ and $\bar{e}_t$ the following equation:

$$\bar{y}(z) = \frac{1}{1 - \sum_{k=1}^{N} Akz^{-k}} \bar{e}(z) \tag{6}$$

The proportionality coefficient between $\bar{y}(z)$ and $\bar{e}(z)$ is a transfer function only having poles (which are the zeros of the denominator) and no zero (the numerator is equal to 1). The filter which performs this transfer function is called an all-pole filter.

The modeling of the signal described by the equations (3) to (6) is well known and is called autoregressive or AR for short, the term regressive indicating the recurring character of the process using a sequence of previously processed samples.

However, the predicted signal can also be obtained by a linear equation which is more complex than equation (4) by using the restored error signals $\bar{e}_{t-k}$ in addition to $\bar{y}_{t-k}$ in accordance with the linear equation:

$$\bar{P}_{t+1} = \sum_{k=1}^{N} Ak_t \bar{y}_{t-k+1} + \sum_{j=1}^{P} Bj_t \bar{e}_{t-j+1} \tag{7}$$

the second summation corresponding to a prediction relative to the error signal $\bar{pe}_t$. Thus, P other coefficients $B1_t, B2_t, \ldots, BP_t$ which affect the samples of the restored error, namely $\bar{e}_t, \bar{e}_{t-1}, \ldots, \bar{e}_{t-P+1}$.

From (3) and (7) is obtained the equation:

$$\bar{y}_{t+1} = \sum_{k=1}^{N} Ak_t \bar{y}_{t-k+1} + \sum_{j=1}^{P} Bj_t \bar{e}_{t-j+1} + e_{t+1} \tag{8}$$

and from this, by the same "z" transformation as hereinbefore, the equation between $\bar{y}(z)$ and $\bar{e}(z)$:

$$\bar{y}(z) = \frac{1 + \sum_{j=1}^{P} Bjz^{-j}}{1 - \sum_{k=1}^{N} Akz^{-k}} \bar{e}(z) \tag{9}$$

This leads to a new transfer function not only having poles (the zeros of the denominator) but also zeros, which are those of the numerator. The filter performing this transfer function is called a pole-zero filter.

The modeling described by equations (3) and (7) to (9) is well known and is called "adjusted mean autoregressive" or AMAR for short. Modeling only involving the use of the numerator of the transfer function (9) is obtained by an all-zero filter and will be of the adjusted mean or AM type.

The present invention relates to the AMAR modeling of restored signals $\bar{y}_{t+1}$ and $\bar{e}_{t+1}$ which uses two series of coefficients, one $A1_t, A2_t, \ldots, AN_t$ affecting N samples $\bar{y}_t, \bar{y}_{t-1}, \ldots, \bar{y}_{t-N+1}$ of the restored signal and the other $B1_t, B2_t, \ldots, BN_t$ affecting P samples $\bar{e}_t, \bar{e}_{t-1}, \ldots, \bar{e}_{t-P+1}$ of the restored error. All these coefficients are readjusted at each time t (sequentially or recursively) in such a way that the mean power of the prediction error signal is minimal.

The context of the invention having already been described, a more specific description thereof will now be provided.

Instead of carrying out the prediction on the basis of signals $\bar{y}_t$ and $\bar{e}_t$ only (as in AMAR modeling), according to the invention use is also made of the real signal $y_t$ and the real error $e_t$. For this purpose, there is on the one hand a linear filtering of $y_t$ using the coefficients $A1_t, A2_t, \ldots, AN_t$ of the conventional modeling of $\bar{y}_{t+1}$, these coefficients affecting N successive samples of the signal $y_t$, namely $y_t, y_{t-1}, \ldots, y_{t-N+1}$ and on the other hand a linear filtering of $e_t$ using the coefficients $B1_t, B2_t, \ldots, BP_t$ of the conventional modeling of $\bar{e}_{t+1}$.

In other words, in the form of quantities:

$$A1_t y_t + A2_t y_{t-1} + \ldots + AN_t y_{t-N+1} \text{ (i.e. } py_t\text{)} \tag{10}$$

and $$B1_t e_t + B2_t e_{t-1} + \ldots + BP_t e_{t-P+1} \text{ (i.e. } pe_t\text{)} \tag{11}$$

In addition, these quantities are respectively weighted by two coefficients between 0 and 1 and not simultaneously zero, these coefficients being called $\gamma_{AR}$ (AR indicating autoregressive) and $\gamma_{MA}$ (the MA indicating adjusted mean).

Finally, the conventional predictions obtained on the restored values $\bar{y}_t$ and $\bar{e}_t$, namely:

$$A1_t \bar{y}_t + A2_t \bar{y}_{t-1} + \ldots + AN_t \bar{y}_{t-N+1} \text{ (i.e. } p\bar{y}_t\text{)} \tag{12}$$

and $$B1_t \bar{e}_t + B2_t \bar{e}_{t-1} + \ldots + BP_t \bar{e}_{t-P+1} \text{ (i.e. } p\bar{e}_t\text{)} \tag{13}$$

are also weighted, by coefficients respectively equal to $(1 - \gamma_{AR})$ and $(1 - \gamma_{MA})$.

Thus, in summarizing according to the invention a prediction signal of form:

$$[(1 - \gamma_{AR}) p\bar{y}_t + \gamma_{AR} py_t] + [(1 - \gamma_{MA}) p\bar{e}_t + \gamma_{MA} pe_t] \tag{14}$$

is formed in which the quantities $p\bar{y}_t$, $py_t$, $p\bar{e}_t$ and $pe_t$ are obtained by the summations defined by equations (10) to (13).

If the coefficients $\gamma_{AR}$ and $\gamma_{MA}$ were both zero, expression (14) would be reduced to $p\bar{y}_t+p\bar{e}_t$, i.e. to the prediction according to the prior art. Conversely, if the coefficients are both equal to unity, expression (14) becomes $py_t+pe_t$ (15).

These considerations only apply in the coding circuit where there are both restored signals $\bar{y}_t$ and $\bar{e}_t$ and real signals $y_t$ and $e_t$. On decoding, there are naturally only restored signals $\bar{y}_t$ and $\bar{e}_t$, so that only the two expressions according to (10) and (11) can be calculated, as in the prior art.

The interest of the specific modeling described hereinbefore with respect to the shaping of the quantization noise is as follows. At time $t+1$, the prediction error $e_{t+1}$ is given by:

$$e_{t+1}=y_{t+1}-p_{t+1} \quad (16)$$

in which the prediction $p_{t+1}$ is given by the expression (14). It follows that the quantization noise on signal ($\Delta y_{t+1}=\bar{y}_{t+1} -y_{t+1}$) is linked with the quantization noise on the prediction error ($\Delta e_{t+1}=\bar{e}_{t+1}-e_{t+1}$) by the equation:

$$\Delta y_{t+1}=\gamma_{AR}[A1_t\Delta y_t+ \ldots$$
$$+AN_t\Delta y_{t-N+1}]+\gamma_{MA}[B1_t\Delta e_t+ \ldots$$
$$+BP_t\Delta e_{t-P+1}]+\Delta e_{t+1} \quad (17)$$

On accepting that the quantization noise $\Delta e_t$ on the prediction error has an approximately flat spectrum, it follows that the spectrum of the quantization noise $\Delta y_t$ on the signal is given by the square of the module of the pole-zero transfer function equal to:

$$\frac{1 + \gamma_{MA}(B1z^{-1} + \ldots + BPz^{-P})}{1 - \gamma_{AR}(A1z^{-1} + \ldots + ANz^{-N})}$$

to that extent that it is assumes that the coefficients $A1_t, \ldots, AN_t, B1_t, \ldots, BP_t$ are relatively slowly readjusted so as to be considered as locally constant. If the constants $A1, \ldots AN, B1 \ldots BP$ are adjusted so as to minimize the average power of the prediction error $\bar{e}_t$ on the restored signal $\bar{y}_t$, the spectrum of the restored signal $\bar{y}_t$ is obtained by taking the square of the module on the unity circle of the pole-zero transfer function equal to:

$$\frac{1 + (B1z^{-1} + \ldots + BPz^{-P})}{1 - (A1z^{-1} + \ldots + ANz^{-N})}$$

For example, the choice of parameters $\gamma_{AR}=\gamma_{MA}=1$ gives the noise $\Delta y_t$ exactly the spectrum of the restored signal $\bar{y}_t$, which corresponds to a shaping by complete parallelism of the spectra, which is the sought objective. Conversely, the choice $\gamma_{MA}=\gamma_{AR}=0$ gives the noise $\Delta y_t$ the flat spectrum, which corresponds to the absence of shaping encountered in the prior art.

Naturally, between these two extreme situations, a random intermediate choice is possible leading to a shaping by approximate parallelism of the spectra of $\bar{y}_t$ and $\Delta y_t$. In particular, the choice $\gamma_{AR}=0$, $\gamma_{MA}=1$ makes it possible to obtain the zeros of the spectrum of $\bar{y}_t$ in the spectrum of $\Delta y_t$.

The tolerances on the parameters $\gamma_{AR}$ and $\gamma_{MA}$ therefore make it possible to carry out the spectral shaping in a random, very simple manner, whilst remaining relatively general. Thus, in this connection, the invention differs from the prior art methods in arriving at the said shaping.

BRIEF SUMMARY OF THE INVENTION

The present invention therefore relates to a coding process of the adaptive prediction differential PCM type in which an error signal $e_t$ is formed between a sample of signal $y_t$ to be coded and a prediction signal $\bar{p}_t$ of said signal in which t is a sampling time, the error signal $e_t$ is quantized, followed by the coding of the quantized signal, a restored error signal $\bar{e}_t$ is formed from the quantized or coded signal, a restored signal $\bar{y}_t$ is formed by adding to $\bar{e}_t$ the prediction signal $\bar{p}_t$ and the said prediction signal $\bar{p}_t$ is formed from restored signals $\bar{y}_t$ and $\bar{e}_t$ by two linear filtering operations, the first relating to N successive samples of $\bar{y}_t$, namely $\bar{y}_t, \bar{y}_{t-1}, \ldots, \bar{y}_{t-N+1}$ and consisting of multiplying these samples (or derived samples) respectively by coefficients $A1_t, A2_t, \ldots, AN_t$, then summating the products obtained in order to obtain a prediction signal $p\bar{y}_t$ and the second relating to P successive samples of $\bar{e}_t$, namely $\bar{e}_t, \bar{e}_{t-1}, \ldots, \bar{e}_{t-P+1}$ and consisting of multiplying these samples respectively by the coefficients $B1_t, B2_t, \ldots, BP_t$ and summating the products obtained to obtain a prediction signal $p\bar{e}_t$, the coefficients $A1_t, \ldots AN_t$ and $B1_t, \ldots, BP_t$ being sequentially adjusted at each time t so that the mean power of the error signal $\bar{e}_t$ is minimal, wherein there is also a shaping of the spectrum of the quantization noise on signal $y_t$ (i.e. $\Delta y_t=\bar{y}_t-y_t$), by making said spectrum parallel to that of the restored signal $\bar{y}_t$ by carrying out at least one of the two following operations (a) and (b):

(a) a linear filtering of signal $y_t$ is formed by using N successive samples of $y_t$, i.e. $y_t, y_{t-1}, y_{t-N+1}$ and by multiplying these samples (or derived samples) by N coefficients equal to the said coefficients $A1_t, A2_t, \ldots, AN_t$, then adding the products obtained which supplies a filtered signal $py_t$, then on the basis of said signal $py_t$ and the signal $p\bar{y}_t$ previously obtained by the filtering of $\bar{y}_t$, a signal $pAR_t$ equal to $\gamma_{AR}py_t+(1-\gamma_{AR})p\bar{y}_t$, in which $\gamma_{AR}$ is a regulatable coefficient between 0 and 1 (terminals included) is obtained;

(b) the unquantized error signal $e_t$ is filtered by multiplying P successive samples of this signal, i.e. $e_t, e_{t-1}, \ldots, e_{t-P+1}$, in P coefficients equal respectively to said coefficients $B1_t, B2_t, \ldots, BP_t$ and the products obtained are added, which supplies a filtered signal $pe_t$, then on the basis of said signal $pe_t$ and the signal $p\bar{e}_t$ obtained previously by filtering $\bar{e}_t$ a signal $pMA_t$ is formed which is equal to $\gamma_{MA}pe_t+(1-\gamma_{MA})p\bar{e}_t$, in which $\gamma_{MA}$ is a regulatable coefficient between 0 and 1 (terminals included), the coefficients $\gamma_{AR}$ and $\gamma_{MA}$ not being simultaneously zero; said operations (a) and (b) being followed by an addition of the signals $pAR_t$ and $pMA_t$, then by a delay of one sampling time of the sum obtained, which supplies the said prediction signal $\bar{p}_t$.

As is known, it may be advantageous, in place of directly processing the samples $\bar{y}_t, \ldots, \bar{y}_{t-N+1}$ to carry out beforehand an "orthogonalization" of said samples so as to decorrelate them to the optimum extent in order to improve the effectiveness of the least squares estimation recursive algorithms. This orthogonalization can be obtained by recursive adjustment of an all-zero lattice filter and better performances are obtained, whilst in no way excessively increasing the complexity of the system. The multiplication operations referred to in the aforementioned definition now no longer relate to the samples of the signal to be processed, but to samples which have been called "derivatives" and which are in the present case orthogonal samples obtained following the said orthogonalization.

The present invention also relates to a coding apparatus of the adaptive prediction differential PCM type for performing the process defined hereinbefore. This apparatus comprises a subtracter with two inputs receiving a sample of the signal to be coded $y_t$ and a prediction signal $\bar{p}_t$ in which t is a sampling time and an output supplying an error signal $e_t$, a quantizer of the error signal $e_t$, followed by a coder of the quantized signal, a circuit able to form a restored error signal $\bar{e}_t$ from the quantized or coded signal, an adder with two inputs receiving the restored error signal and the prediction signal $\bar{p}_t$ and with an output supplying a restored signal $\bar{y}_t$ and a predictor receiving the restored signal $\bar{y}_t$ and $\bar{e}_t$ and supplying the said prediction signal $\bar{p}_t$, said predictor comprising two linear filters, the first acting on the restored signal $\bar{y}_t$ and comprising N circuits for the formation of coefficients $A1_t$, $A2_t$, ..., $AN_t$, a first group of N multipliers with two inputs respectively receiving N successive samples of $\bar{y}_t$ to be filtered, i.e. $\bar{y}_t$, $\bar{y}_{t-1}$, ..., $\bar{y}_{t-N+1}$ (or derived samples) and said N coefficients and an adder with N inputs connected to N multipliers of the first group and with an output supplying a prediction signal $p\bar{y}_t$, the second comprising P circuits for the formation of P coefficients $B1_t$, $B2_t$, ..., $BP_t$ and a second group of P multipliers with two inputs respectively receiving the P successive samples of $\bar{e}_t$, i.e. $\bar{e}_t$, $\bar{e}_{t-1}$, ..., $\bar{e}_{t-P+1}$ and said P coefficients and an adder with P inputs connected to the P multipliers of the second group and with an output supplying a prediction signal $p\bar{e}_t$, said two filters comprising means for sequentially adjusting at each time t the coefficients $A1_t$, ..., $AN_t$ and $B1_t$, ..., $BP_t$ in such a way that the mean power of the error signal $e_t$ is minimal, wherein the predictor comprises means for shaping the spectrum of the quantization noise on $y_t$ (i.e. $\Delta y_t = \bar{y}_t - y_t$) by arranging said spectrum in parallel with that of the restored signal $\bar{y}_t$, said means comprising:

(A) at least one of the following circuits:

(a) a first circuit constituted by a filter of signal $y_t$ comprising a first group of N multipliers with two inputs respectively receiving N successive samples of $y_t$, i.e. $y_t$, $y_{t-1}$, ..., $y_{t-N+1}$ (or derived samples) and N coefficients respectively equal to said coefficients $A1_t$, $A2_t$, ..., $AN_t$ sampled in the first filter of the predictor acting on $\bar{y}_t$ and an adding circuit with N inputs connected to the N multipliers of the first group and with an output supplying a filtered signal $py_t$ and and by a first algebraic circuit with two inputs, one connected to the output of the filter of $\bar{y}_t$ and receiving the signal $p\bar{y}_t$ and the other connected to the output of the filter $y_t$ and receiving the signal $py_t$, said first algebraic circuit supplying at one output a signal $pAR_t$ equal to $\gamma_{AR} py_t + (1 - \gamma_{AR}) p\bar{y}_t$, in which $\gamma_{AR}$ is a regulatable coefficient between 0 and 1 (terminals included);

(b) a second circuit constituted by a filter of the unquantized error signal $e_t$ comprising a second group of P multipliers with two inputs respectively receiving P successive samples of $e_t$, i.e. $e_t$, $e_{t-1}$, ..., $e_{t-P+1}$ and P coefficients equal then respectively to said coefficients $B1_t$, $B2_t$, ..., $BP_t$ sampled in the second filter of the predictor acting on $\bar{e}_t$ and an adder with P inputs connected to P multipliers of the second group and with an output supplying a filtered signal $pe_t$ and by a second algebraic circuit with two inputs, one connected to the output of the filter of $e_t$ and receiving the signal $pe_t$ and the other to the output of the filter of $\bar{e}_t$ and receiving the signal $p\bar{e}_t$, said second algebraic circuit supplying at an output a signal $pMA_t$ equal to $\gamma_{MA} pe_t + (1 - \gamma_{MA}) p\bar{e}_t$, in which $\gamma_{MA}$ is a regulatable coefficient between 0 and 1 (terminals included), the coefficients $\gamma_{MA}$ and $\gamma_{AR}$ not being simultaneously zero;

(B) an adder with two inputs connected to the outputs of the first and second algebraic circuits and with an output supplying a signal $pAR_t + pMA_t$;

(C) a circuit with a delay of one sampling period with an input connected to the output of the adder and an output supplying the said prediction signal $\bar{p}_t$.

In connection with the apparatus according to the invention, there is a variant using a prior orthogonalization of the samples of the signal $y_t$ to be processed by means of a lattice filter.

The invention does not relate to the equipment for adapting the coefficients $A1_t \ldots AN_t$ and $B1_t \ldots BP_t$. However, for illustrative purposes, a description will be given of the known equipment permitting this adaptation to be carried out. With regards to the special case of the adaptation of the coefficients of a lattice filter, reference can be made to the following articles:

J. MAKHOUL and R. VISWANATHAN: "Adaptive lattice methods for linear prediction;" IEEE ASSP (Tulsa) 1978;

J. MAKHOUL: "Stable and efficient lattice methods for linear prediction" published in the Journal IEEE Transactions on Acoustics, Speech and Signal Processing (ASSP), October 1977.

A higher performance adaptive apparatus is described in French Patent Application EN 80 0883 filed on April 21st 1980 and entitled "Adaptive prediction circuit using a lattice filter and corresponding differential TCM coding or decoding apparatus".

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

The understanding of the circuits to be described hereinafter calls on standard logical conventions. The synchronization of the system of operations necessitates the use of delay circuits and registers which are not shown, except when this is necessary for the understanding of the represented means. Thus, for example, the sampling clock pulse H must be correctly delayed where this is necessary. Moreover, the number of bits necessary for coding the signals is not defined and depends on the degree of precision required. The numbering of the circuits belonging to the same diagram in the form n/1, n/2 ... n/K refers to identical circuits fulfilling the same function. Two variants of one and the same circuit can in part use identical circuitry, when the same references will be used.

Figure 1:
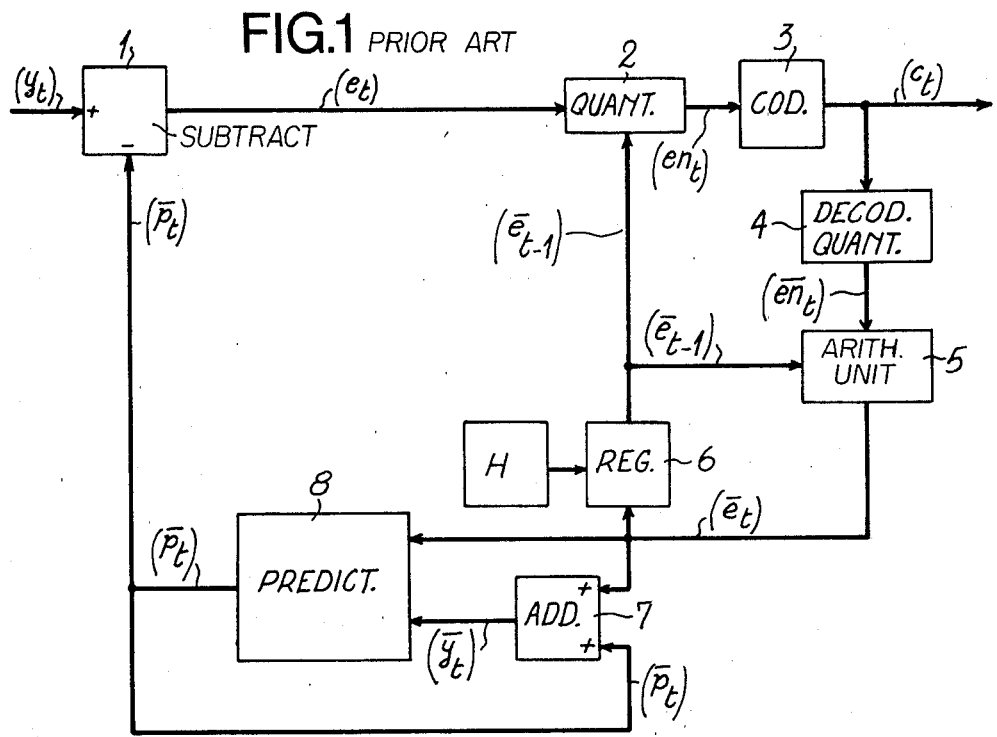
FIG. 1, a coding ADPCM circuit according to the prior art.
Figure 3:
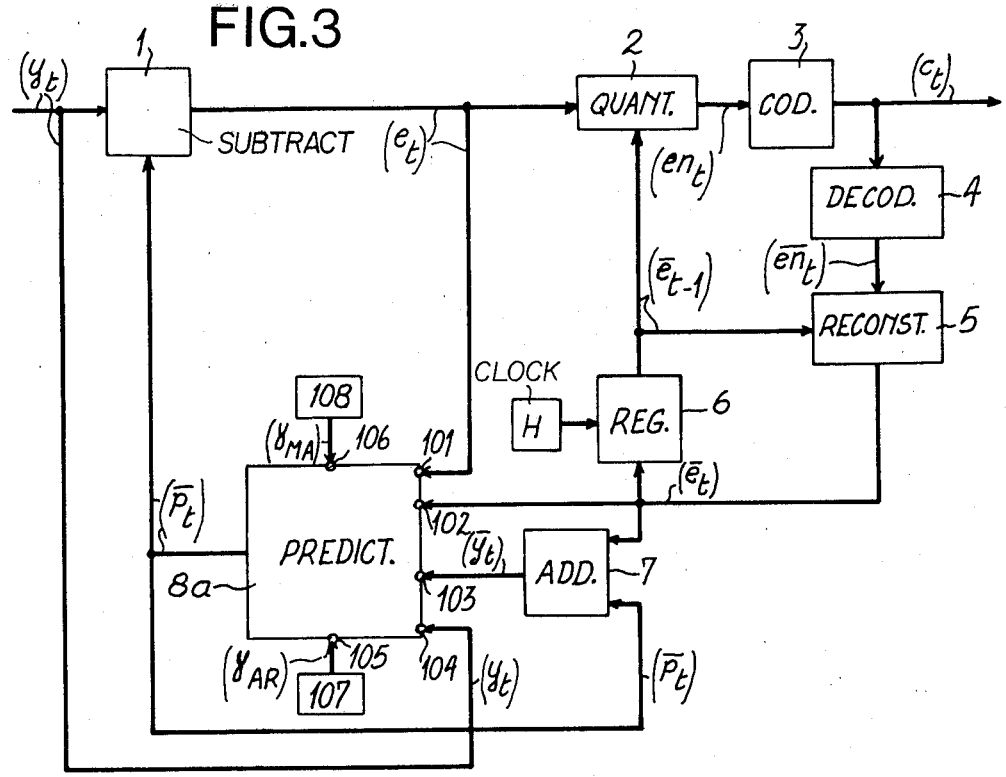
FIGS. 3, 4 and 5 three variants of the invention in which shaping of the quantization noise is obtained respectively by pole-zero filtering, all-zero filtering and all-pole filtering.

FIG. 3 is a diagram of an ADPMS coding circuit with shaping of the quantization noise by a pole-zero adaptive filter. Circuits 1, 2, 3, 4, 5, 6, 7 are identical to the corresponding circuits of FIG. 1. The difference compared with the circuits of FIG. 1 is in connection with the adaptive predictor 8 which has four inputs 101, 102, 103, 104 (instead of two), said inputs respectively receiving the signals $e_t$, $\bar{e}_t$, $\bar{y}_t$ and $y_t$ and two control inputs 105, 106 receiving the coefficients $\gamma_{MA}$ and $\gamma_{AR}$ adjusted by two means 107, 108. These inputs serve to supply the predictor 8a with supplementary signals $y_t$ and $e_t$ and the coefficients $\gamma_{MA}$, $\gamma_{AR}$, used in the shaping operations of the quantization noise according to the invention.

As indicated hereinbefore, it is not necessary to simultaneously act on $y_t$ and $e_t$ and compromises can be made in which the shaping of the quantization noise spectrum by parallelism is only partial and is obtained by acting either only on $e_t$ or $y_t$.

Figure 4:
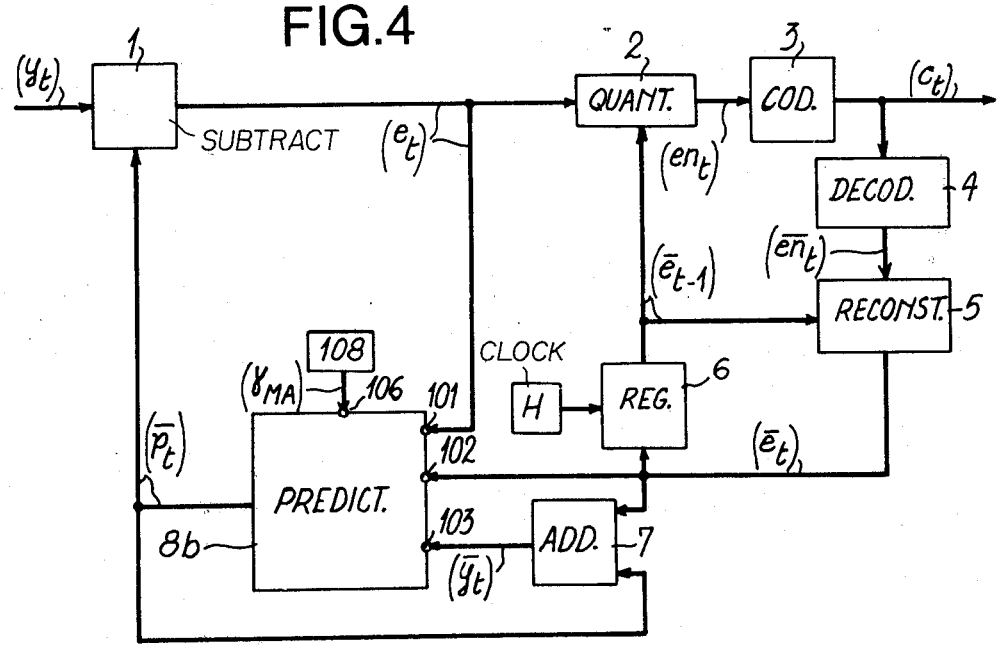

FIG. 4 shows the general structure of the coder in the first case where the predictor 8b only has inputs 101, 102, 103 receiving signals $e_t$, $\bar{e}_t$ and $\bar{y}_t$ and 106 receiving the coefficient $\gamma_{MA}$.

Figure 5:
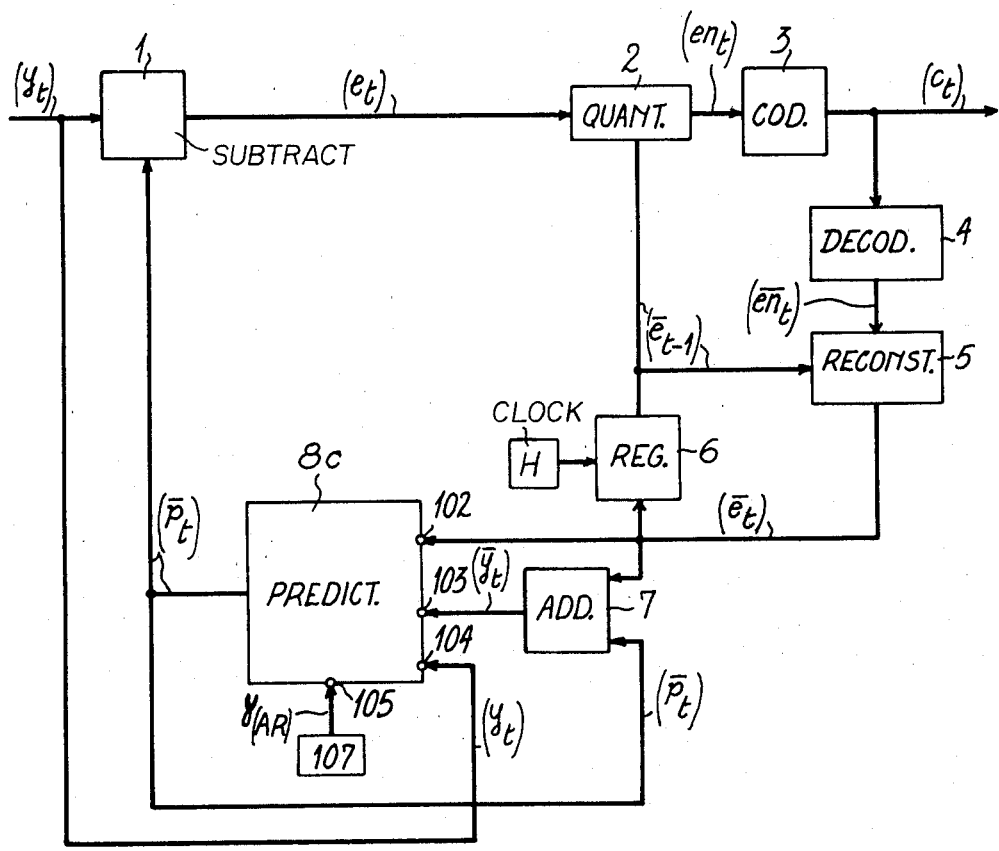

FIG. 5 shows the general structure of the coder in the second case where the predictor 8c only has inputs 102, 103, 104 receiving $\bar{e}_t$, $\bar{y}_t$ and $y_t$ and 105 receiving coefficient $\gamma_{AR}$.

Figure 6:
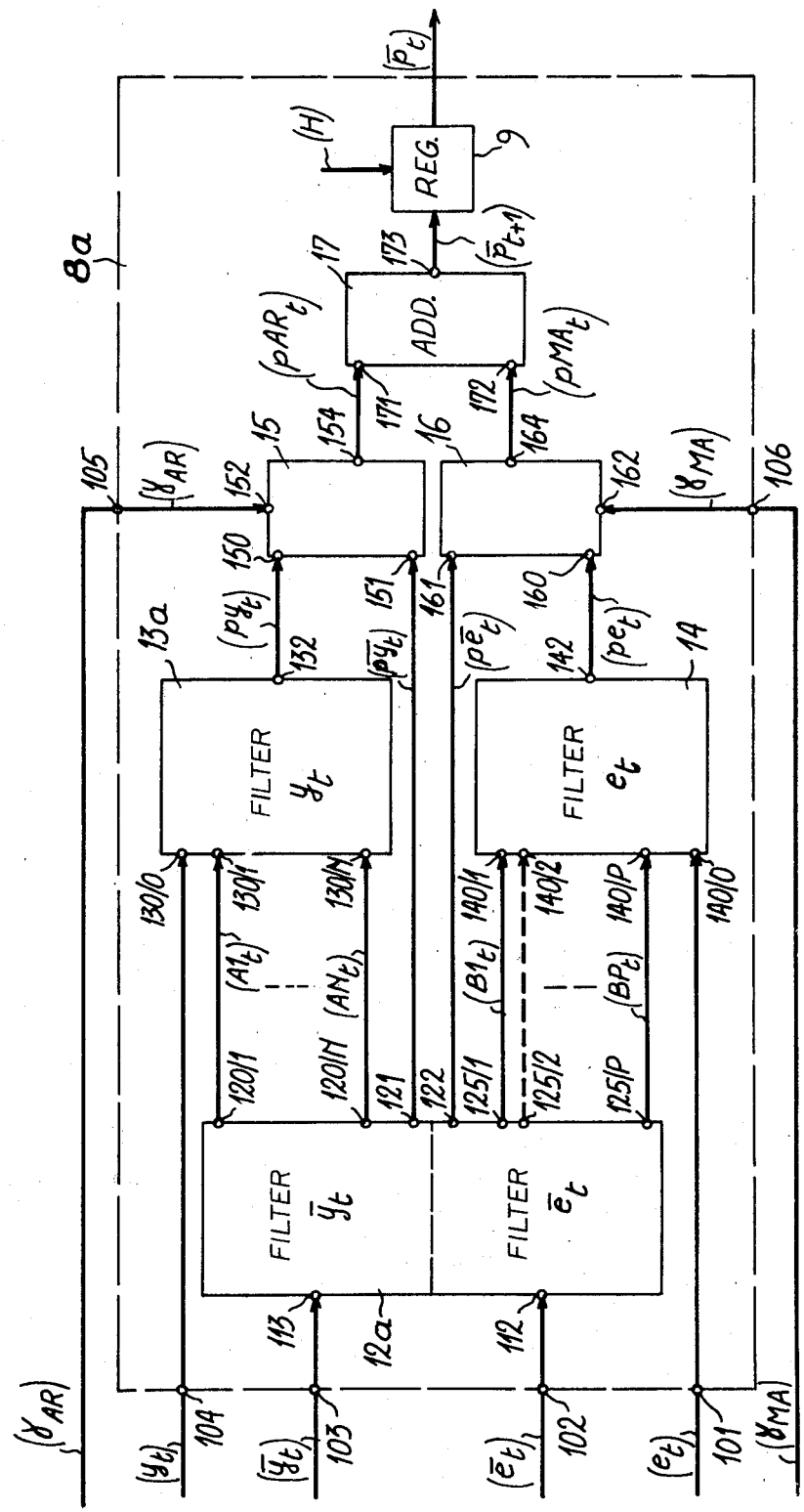
FIGS. 6 and 7 two variants of a pole-zero adaptive prediction circuit with shaping by pole-zero filtering of the quantization noise according to the invention, the first without orthogonalization and the second with orthogonalization.
Figure 7:
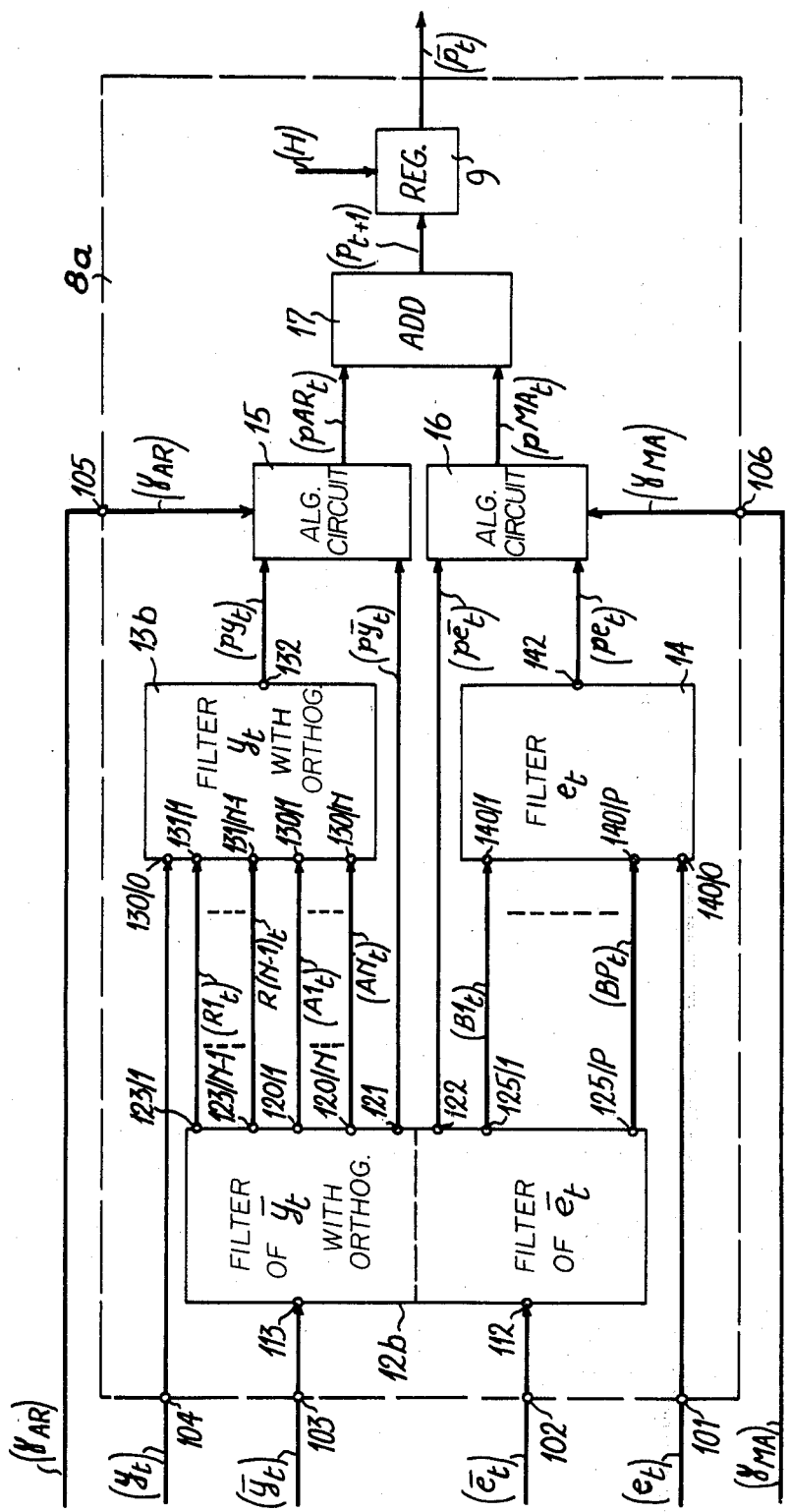
Figure 8:
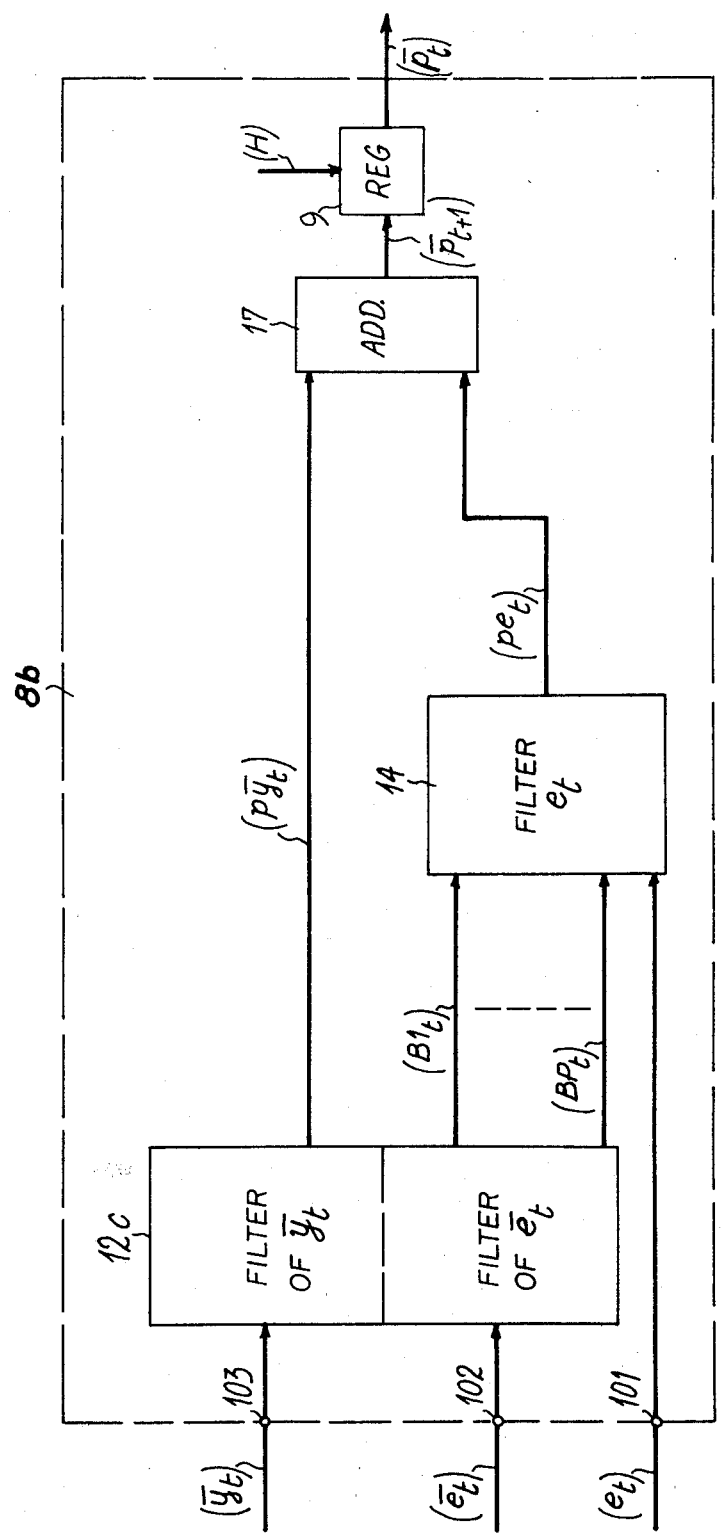
FIG. 8 a block diagram of a variant of a pole-zero adaptive prediction circuit with shaping by all-zero filtering of the quantization noise according to the invention.
Figure 9:
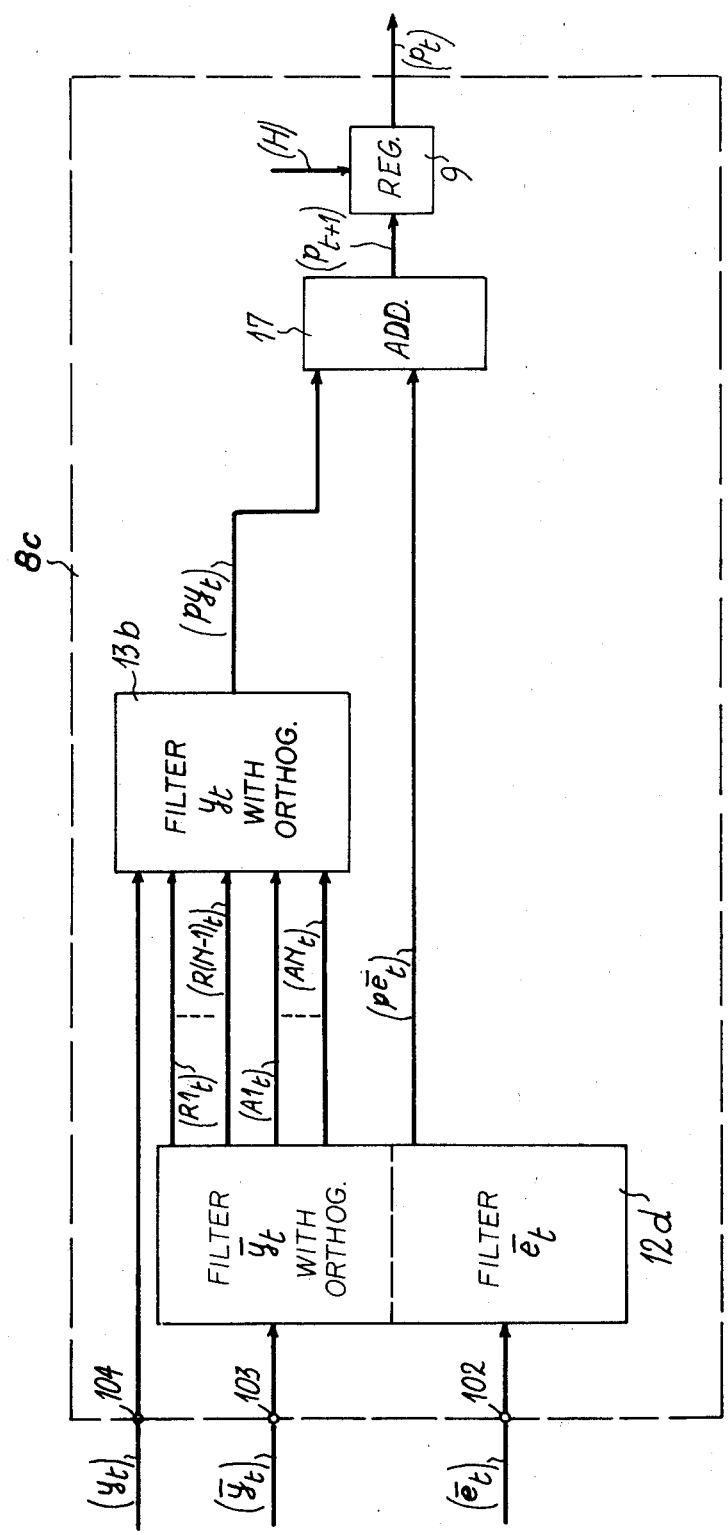
FIG. 9 a block diagram of a variant of the pole-zero adaptive prediction circuit with shaping by all-pole filtering of the quantization noise according to the invention.

FIGS. 3, 4 and 5 thus illustrate the three essential variants of the coder according to the invention. The function of the following drawings is to describe in greater detail predictor 8 in three corresponding forms 8a, 8b and 8c:

predictor 8a in FIGS. 6 and 7;
predictor 8b in FIG. 8;
predictor 8c in FIG. 9.

The diagram of FIG. 6 shows a variant of the adaptive prediction circuit 8a with shaping of the quantization noise by an adaptive pole-zero filter.

Inputs 102 and 103 receive $\bar{e}_t$ and $\bar{y}_t$ and are respectively connected to the two inputs 112, 113 of a pole-zero filtering circuit 12a. This circuit has a first group of N outputs 120/1, 120/2 ... 120/N carrying signals $A1_t$, ..., $An_t$, ..., $AN_t$ and connecting to N inputs 130/1, 130/2, ... 130/N of a circuit 13a for filtering signal $y_t$, the latter being applied by an input 130/0. Circuit 12a also has a second group of P outputs 125/1, 125/2 ... 125/P carrying signals $B1_t$, $B2_t$... $BP_t$ and connected to P inputs 140/1, 140/2 ... 140/P of a circuit 14 for filtering signal $e_t$, which is applied by an input 140/0. Circuit 12a also has an output 121 which supplies a signal $py_t$ and an output 122 which supplies a signal $p\bar{e}_t$.

The filtering circuit 13a has an output 132 which carries a signal $py_t$ applied to the input 150 of an algebraic circuit 15, which has a second input 151 connected to output 121 of circuit 12a and receiving therefrom signal $p\bar{y}_t$. Circuit 15 has a third input 152 connected to the input 105 from where it receives a signal representing a coefficient $\gamma_{AR}$. Circuit 15 has an output 154 which supplies a signal $pAR_t$ equal to $\gamma_{AR}py_t+(1-\gamma_{AR})p\bar{y}_t$.

Filtering circuit 14 has an output 142 carrying a signal $pe_t$ applied to the input 160 of an algebraic circuit 16 having a second input 161 connected to the output 122 of circuit 12a and receiving therefrom signal $p\bar{e}_t$. Circuit 16 has a third input 162 connected to input 106 from where it receives a signal representing a coefficient $\gamma_{MA}$. This circuit has an output 164 which supplies a sigal $pMA_t$ equal to $\gamma_{MA}pe_t+(1-\gamma_{MA})p\bar{e}_t$.

The circuit shown also has an adder 17 with two inputs 171, 172, respectively connected to two outputs 154, 164 and to an output 173 supplying a signal $\bar{p}_{t+1}$.

Finally, circuit 8a comprises a register 9 controlled by clock signal H, which delays the signal $\bar{p}_{t+1}$ received and supplies a signal $\bar{p}_t$, which is the prediction signal.

Figure 10:
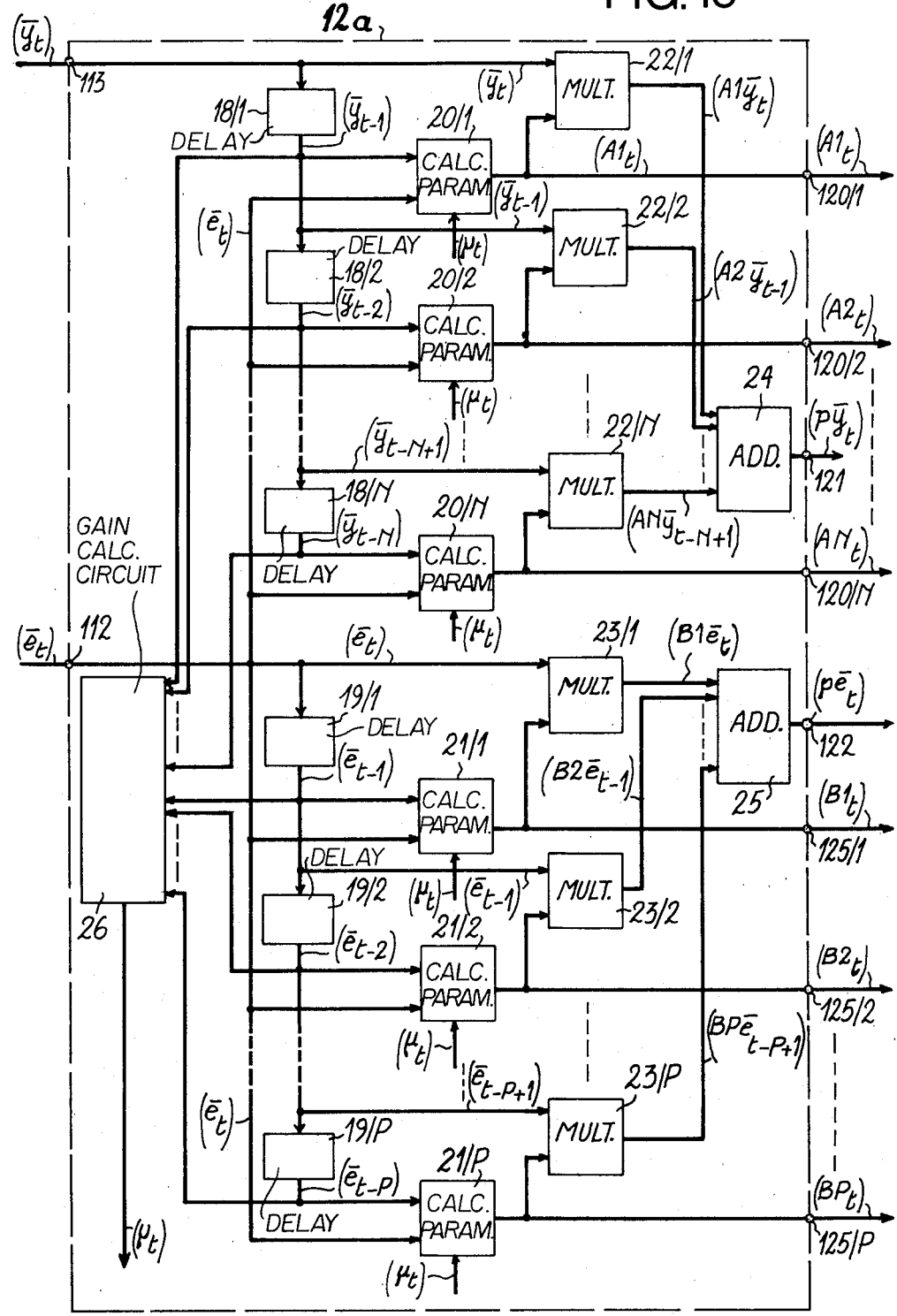
FIGS. 10 and 11 respectively block diagrams of two variants of the pole-zero modeling circuit of the restored signal $\bar{y}_t$ without and with an orthogonalizing circuit.
Figure 12:
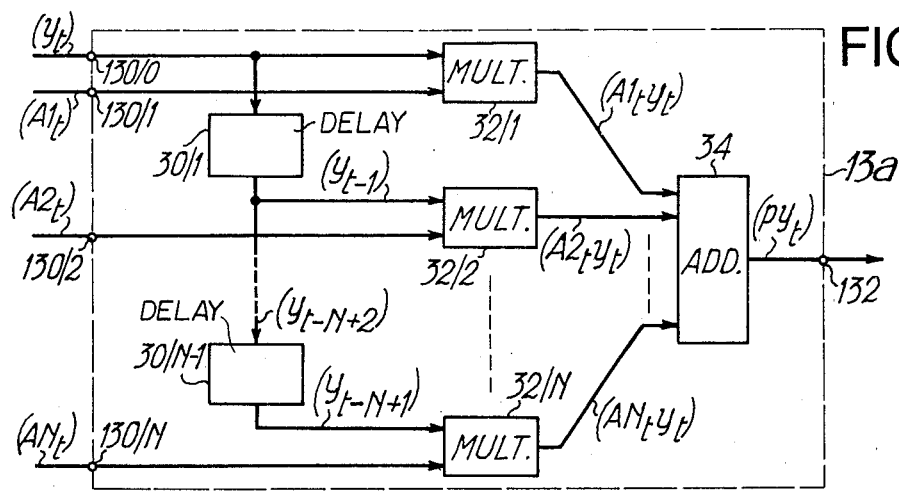
FIG. 12 a filtering circuit for the signal $y_t$ without orthogonalizer.
Figure 13:
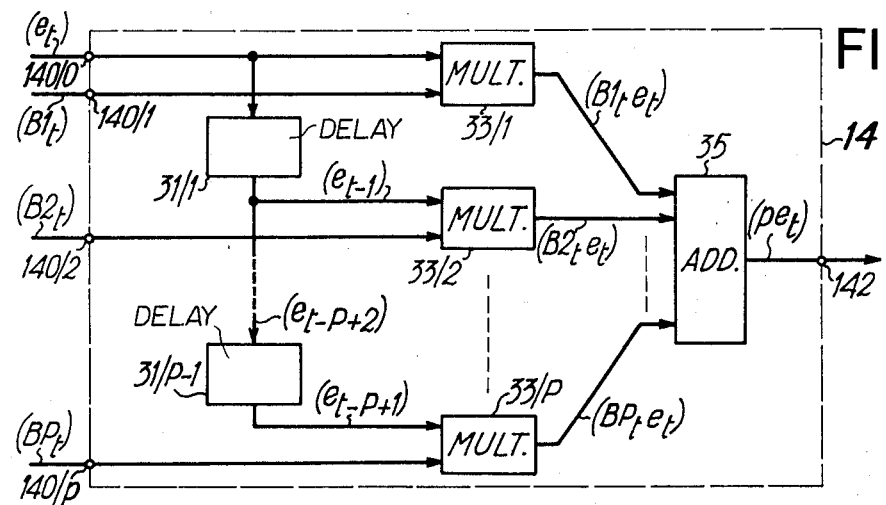
FIG. 13 a filtering circuit of the signal $e_t$.

Circuit 12a is shown in FIG. 10, circuit 13a in FIG. 12 and circuit 14 in FIG. 13.

In the represented embodiment, the signal $p\bar{y}_t+p\bar{e}_t$ is a prediction of signal $\bar{y}_{t+1}$ obtained by adjustment of the pole-zero filter 12a, whose coefficients A1, ... 1N, B1 ... BP are chosen in such a way as to minimize the mean power of the prediction error $\bar{y}_{t+1}-p\bar{y}_t-p\bar{e}_{t=\bar{e}_{t+1}}$. Filters 13a and 14 respectively transform the signals $y_t$ into $py_t$ and $\bar{e}_t$ into $pe_t$ and are identical to those which respectively transform $\bar{y}_t$ into $p\bar{y}_t$ and $\bar{e}_t$ into $p\bar{e}_t$. The coefficients of the latter are transmitted to the former for this purpose. The prediction of the signal $y_{t+1}$ to be coded is then $\bar{p}_{t+1}=pAR_t+MA_t$. It is charged into register 9 and is read at time t+1 under the effect of the appropriately phase-regulated clock pulse H. This prediction is subtracted from the new sample $y_{t+1}$ to obtain the new prediction error $e_{t+1}$.

Figure 11:
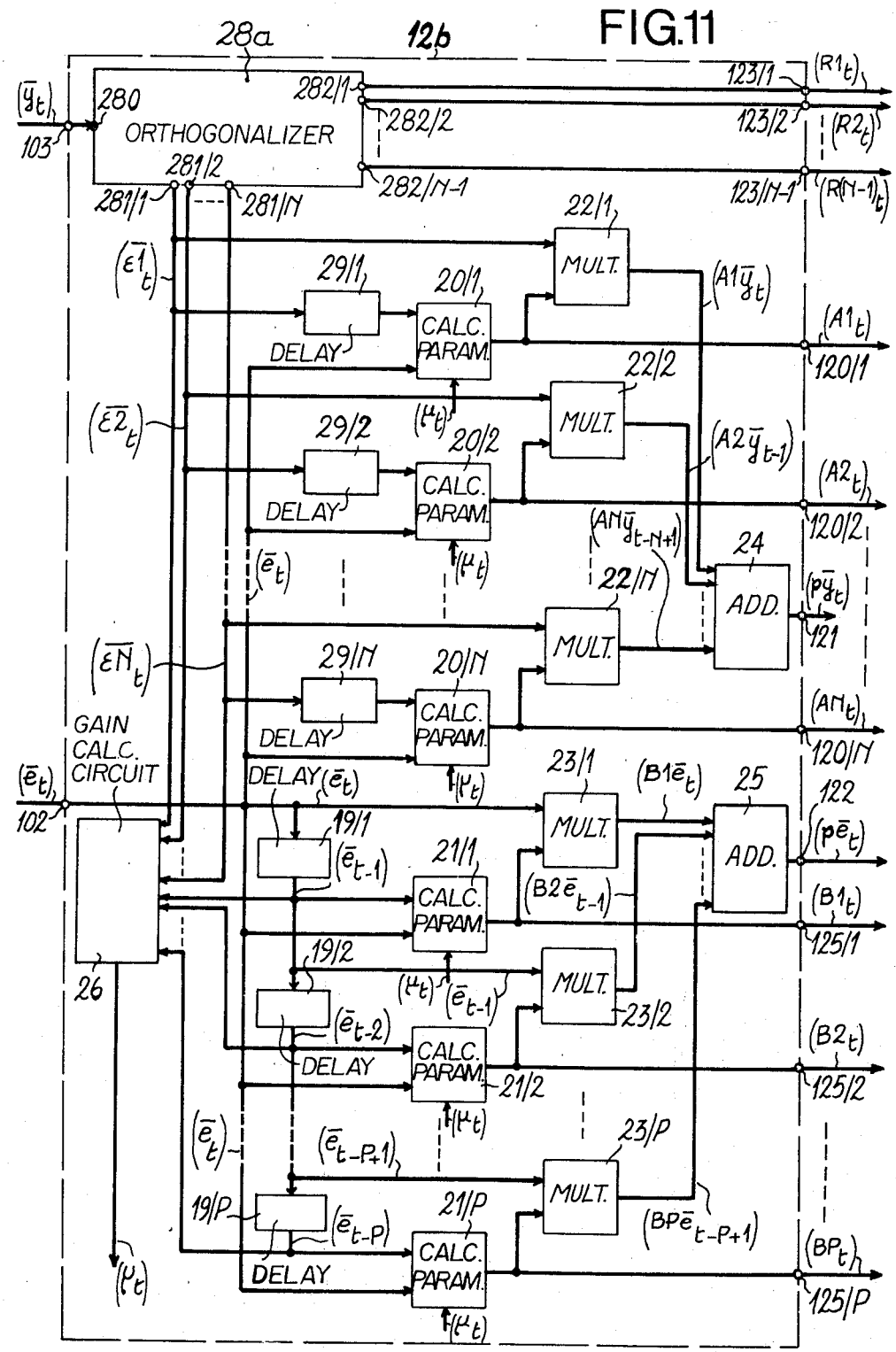

FIG. 7 shows a variant of the adaptive prediction circuit 8a with shaping of the quantization noise by an adaptive pole-zero filter. Circuits 14, 15, 16, 17 and 9 are identical to the corresponding circuits of FIG. 6. The differences occur in connection with the modeling circuit 12b, which differs from circuit 12a by the fact that it comprises an orthogonalizer. Circuit 12b comprises a third group of outputs 123/1, 123/2 ... 123/N−1 which supply the N−1 orthogonalization coefficients R1$_t$, R2$_t$, ... R(N−1)$_t$. Circuit 13b then also comprises an orthogonalization circuit using the same coefficients and which, to this end, is provided with a group of N−1 inputs 131/1, ... 131/N−1 respectively connected to the outputs 123/1 ... 123/N−1 of circuit 12b. Circuit 12b is shown in FIG. 11 and circuit 13b in FIG. 14.

The diagram of FIG. 6 is a general case, but as indicated hereinbefore, special cases can be obtained as a function of values of coefficients $\gamma_{AR}$ and $\gamma_{MA}$ which are between 0 and 1, the two coefficients simultaneously zero corresponding to the absence of shaping.

The following table gives the different possible cases according to the values of $\gamma_{AR}$ and $\gamma_{MA}$. The third column indicates the filter making it possible to pass from the quantization noise $\Delta e_t = e_t - \bar{e}_t$ on the prediction error to the quantization noise $\Delta y_t = y_t - \bar{y}_t$ on the signal to be coded.

The diagram of FIG. 8 shows the case where $\gamma_{MA} = 1$ and $\gamma_{AR} = 0$, which corresponds to the adaptive prediction circuit 6b with shaping of the quantization noise by an adaptive all-zero filter 12c. Circuits 14, 17 and 9 are identical to the corresponding circuits of FIG. 6.

The diagram of FIG. 9 shows the case where $\gamma_{MA} = 0$ and $\gamma_{AR} = 1$, which corresponds to the adaptive prediction circuit 8-c with shaping of the quantization noise by an adaptive all-pole filter. Circuits 13-b, 17 and 9 are identical to the corresponding circuits of FIG. 7.

The general structure of the apparatus according to the invention has now been described and its essential component parts will now be described in greater detail.

The diagram of FIG. 10 firstly shows the pole-zero modeling circuit 12a of signal $\bar{y}_t$, as shown in FIG. 6.

The circuit comprises N one-sample delay circuits (or sequential stores) 18/1, 18/2 ... 18/N, P other circuits of the same type 19/1, 19/2 ... 19/P, N parameter calculating circuits 20/1, 20/2 ... 20/N having a control input, P other parameter calculating circuits of the same type 21/1, 21/2 ... 21/N, N two-input multipliers 22/1, 22/2 ... 22/N, P other two-input multipliers 23/1, 23/2 ... 23/P, an adder 24 with N inputs and an output 121, an adder 25 with P inputs and an output 122, a gain calculating circuit 26 with N+P inputs connected to the outputs of N+P delay circuits and an output supplying a signal $\mu_t$ applied to the control inputs of all the parameter calculating circuits.

Input 113 of the circuit receives signal $\bar{y}_t$, which is applied on the one hand to a first input of multiplication circuit 22/1 and on the other to an input of circuit 18/1. The output of circuit 18/1 supplies a delayed signal $y_{t-1}$ which is applied to an input of gain calculation circuit 26, to a first input of the parameter calculating circuit 20/1, to the first input of multiplication circuit 22/2 and finally to the input of circuit 18/2. These same connections also exist on the other circuits, except for the last: circuit 18/N receives the signal $\bar{y}_{t-N+1}$ and its output supplies a signal $\bar{y}_{t-N}$ which is only supplied to the corresponding input of circuit 26 and to the first input of circuit 20/N.

Input 112 of the circuit receives signal $\bar{e}_t$ which is applied to the second input of parameter calculating circuits 20/1 ... 20/N and 21/1 ... 21/P to the first input of the multiplication circuit 23/1 and to the input of delay circuit 19/1. The output of circuit 19/1 supplies a signal $\bar{e}_{t-1}$, which is applied to the corresponding input of circuit 26, to the first input of circuit 21/1, to the first input of circuit 23/2 and finally to the input of circuit 19/2. The same connections also exist in connection with the following circuits up to circuit 19/P, which receives $\bar{e}_{t-P+1}$ and whose output supplies a signal $\bar{e}_{t-P}$ applied to the corresponding input of circuit 26 and to the first input of circuit 21/P. The outputs of circuits 20/1 ... 20/N, designated respectively 120/1, 120/2 ... 120/N supply the coefficients A1$_t$... AN$_t$ and are outputs of circuit 12a. Furthermore, they are respectively connected to the second input of multiplication circuits 22/1 ... 22/N, whose outputs respectively carry signals A1$\bar{y}_t$ ... AN$\bar{y}_{t-N+1}$ applied to N corresponding inputs of adding circuit 24, whose output 121 is an output of circuit 12a which supplies $p\bar{y}_t$.

The outputs of circuits 21/1 ... 21/P, designated respectively 125/1 ... 125/P supply coefficients B1$_t$ ... BP$_t$ and are outputs of circuits 12-a. They are also respectively connected to the second input of circuits 23/1 ... 23/P, whose respective outputs supplies signals B1$\bar{e}_t$ ... BP$\bar{e}_{t-P+1}$ applied to the corresponding inputs of adding circuit 25, whose output 122 is an output of circuit 12-a which supplies $p\bar{e}_t$.

Figure 2:
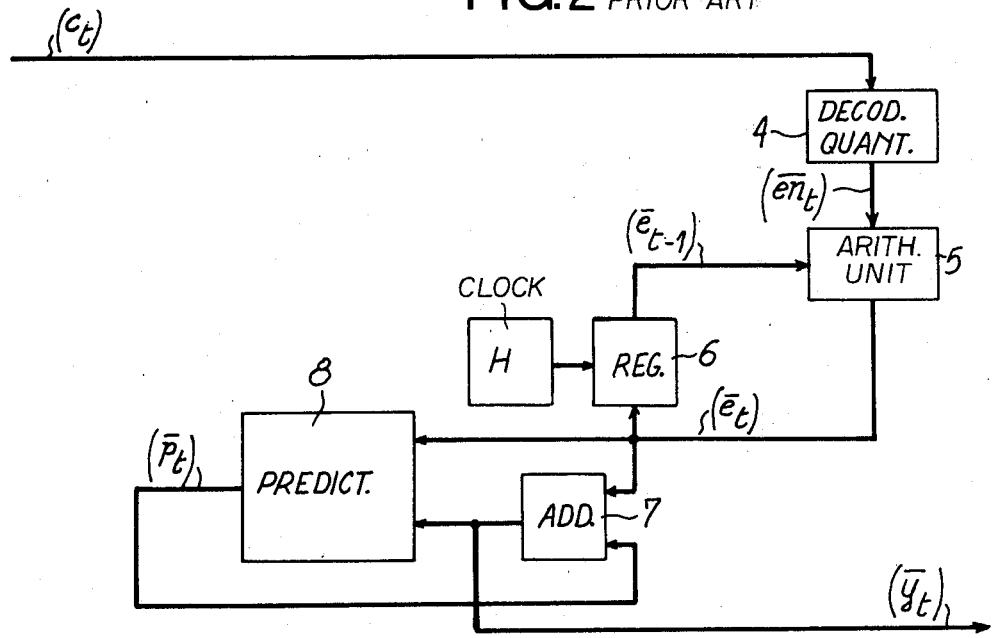
FIG. 2, a decoding ADPCM circuit according to the prior art.

Circuit 12-c of FIG. 8 can be obtained by eliminating in circuit 12-a of FIG. 10 the connections giving access to outputs 120/1 ... 120/N supplying coefficients A1$_t$ ... AN$_t$. A version of circuit 12 is obtained by the elimination in circuit 12-a of the connections giving access to outputs 120/1 ... 120/N supplying A1$_t$ ... AN$_t$ and to the outputs 125/1 ... 125/P supplying B1$_t$ ... BP$_t$. This version must necessarily be used in the receiver (cf FIG. 2) when one of the circuits 12-a or 12-c is used in the transmitter (FIG. 1). Finally, a variant of circuit 12-a is obtained by eliminating circuit 26 and the connections leading to it, the control input of circuits 20/1 ... 20/N, 21/1 ... 21/P then being connected to a circuit supplying a constant signal.

In the represented embodiment, signal: $p\bar{y}_t + p\bar{e}_t = A1 \cdot \bar{y}_t + ... + AN\bar{y}_{t-N+1} + B1\bar{e}_t + ... + BP\bar{e}_{t-P+1}$ is a prediction of the signal $\bar{y}_{t+1}$, the coefficients A1$_t$ ... AN$_t$ and B1$_t$ ... BP$_t$ of the pole-zero prediction filter being recursively adjusted by circuits 20/1 ... 20/N and 21/1 ... 21/P so as to minimize the mean power of the prediction error $\bar{e}_{t+1}$.

The algebraic circuits 20/1 ... 20/N, 21/1 ... 21/P can be realised by N+P identical circuits working in parallel or by a single processor operating with time multiplexing, the management of the multiplexing operation not being indicated here. This also applies in connection with multiplication circuits 22/1 ... 22/N, 23/1 ... 23/P.

The diagram of FIG. 11 shows the pole-zero modeling circuit 12-b of signal $\bar{y}_t$ in the variant comprising an orthogonalizer. The circuits already described in connection with FIG. 10 carry the same references.

The originality of circuit 12-b of FIG. 11 compared with circuit 12-a of FIG. 10 is based on the presence of an orthogonalizer 28a, which receives the signal $\bar{y}_t$ on an input 280 and which supplies N orthogonal samples $\bar{\epsilon}1_t, \bar{\epsilon}2_t, ... \bar{\epsilon}N_t$ on N outputs 281/1, 281/2 ... 281/N and N−1 so-called partial correlation or reflection coefficients R1$_t$, R2$_t$, ... R(N−1)$_t$ on N−1 outputs 282/1, 282/2 ... 282/N−1, which are respectively connected to N−1 outputs 123/1, 123/2, ... 123/N−1 of circuit 12b and are then connected to N−1 inputs of circuit 13b of FIG. 7.

In the circuit of FIG. 11, multipliers 22/1 ... 22/N and delay circuits 29/1 ... 29/N receive orthogonal signals $\bar{\epsilon}1_t ... \bar{\epsilon}N_t$ instead of samples $\bar{y}_t ... \bar{y}_{t-N+1}$ as for FIG. 10.

A version of circuit 12c of FIG. 8 is obtained by the elimination in circuit 12b of FIG. 11 of the connections giving access to outputs 123/1 ... 123/N−1 and 120/1 ... 120/N. Circuit 12d of FIG. 9 is obtained by the elimination in circuit 12b of FIG. 11 of the connections giving access to outputs 125/1 ... 125/P. Another version of circuit 12 is obtained by the elimination in circuit 12b of the connections giving access to the outputs supplying coefficients $R1_t ... R(N−1)_t$, $A1_t ... AN_t$, $B1_t ... BP_t$. This version of the circuit is necessarily used in the receiver when one of the circuits 12b, 12c (in the version described here) or 12d is used in the transmitter.

Finally, a variant of the circuit 12b is obtained by eliminating circuit 26 and the connections leading to it, the third input of circuits 20/1 ... 20/N, 21/1 ... 21/P then being connected to a circuit supplying a constant signal $\mu$.

In the illustrated embodiment, the signal $p\bar{y}_t + p\bar{e}_t$ is another way of calculating the prediction of the signal $\bar{y}_{t+1}$ in accordance with the rules referred to hereinbefore in connection with FIG. 10, the difference being in the preliminary processing carried out in circuit 28a of samples $\bar{y}_t ... \bar{y}_{t-N+1}$ so as to orthogonalize them relative to one another in sense of least squares. The same remark as made for FIG. 10 applies with regard to circuits 20/1 ... 20/N, 21/1 ... 21/P or 22/1 ... 22/N, 23/1 ... 23/P.

FIG. 12 is a diagram of the circuit 13a for filtering signal $y_t$ as shown in FIG. 6. The represented filter comprises N−1 delay line or circuits for the delay of a sample 30/1, 30/2 ... 30/N−1, N multipliers with two inputs 32/1, 32/2 ... 32/N and an adder 34 with N inputs connected to said multipliers and to an output connected to the output 132 of the circuit.

Input 130/0 receives signal $y_t$ which is applied to the first input of multiplication circuit 32/1 and to the input of delay circuit 30/1. The same connections apply with the corresponding numbers up to the input of delay circuit 30/N−1 which receives $y_{t-N+2}$ and supplies $y_{t-N+1}$, which is applied to the first input of multiplication circuit 32/N. The inputs 130/1, 130/2 ... 130/N receiving signals $A1_t ... AN_t$ are respectively connected to the second input of circuits 32/1 ... 32/N, whose respective outputs supply the signals produced $A1_t y_t$, $AN_t y_t$ which are then applied to the Ncorresponding inputs of the adding circuit 34, whose output forming the output 132 of the circuit supplies $py_t$.

FIG. 13 shows the filtering circuit 14 of $e_t$. The circuit comprises P−1 one-sample delay circuits 31/1 ... 31/P−1, P two-input multipliers 33/1, 33/2 ... 33/P and an adder 35 with P inputs connected to the multipliers, said adder having an output 142.

Input 140/0 receives signal $e_t$, which is applied to the first input of multiplication circuit 33/1 and to the input of delay circuit 31/1. The same connections apply, with the corresponding numbers, up to the input of circuit 31/P−1, which receives a signal $e_{t-P+2}$ and whose output supplies a signal $e_{t-P+1}$ applied to the first input of circuit 33/P. The inputs of circuit 14, 140/1, 140/2 ... 140/P carry the coefficients $B1_t ... BP_t$ and are respectively connected to the second input of circuits 33/1 ... 33/P, whose respective outputs supply the signals produced $B1_t e_t$, which are applied to the corresponding inputs of adding circuit 35, whose output forming the output 142 of circuit 14 supplies $pe_t$.

In the represented embodiment, signal $py_t$ supplied by circuit 13a of FIG. 12 added to circuit $pe_t$ supplied by circuit 14 of FIG. 13 is a pseudo-prediction of the signal $y_{t+1}$ using the pole-zero prediction filter adjusted so as to model the restored signal $\bar{y}_t$.

Figure 14:
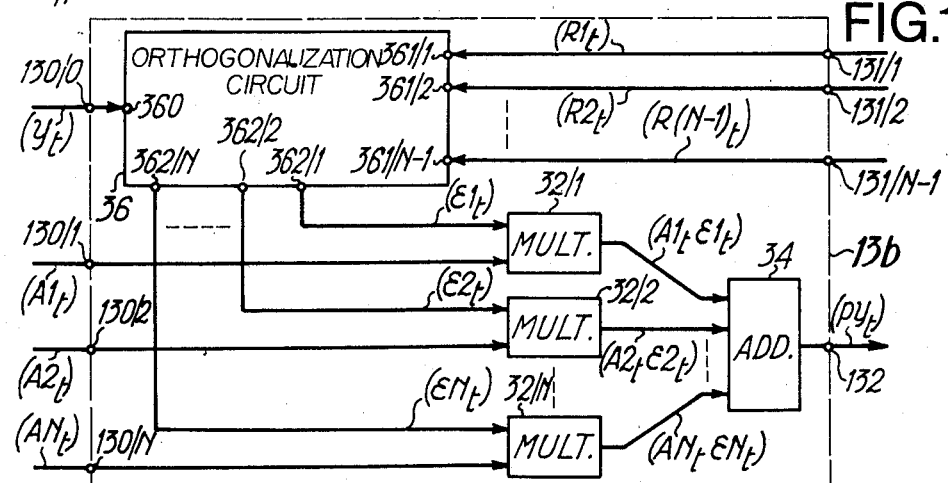
FIG. 14 a filtering circuit of $y_t$ with the orthogonalizer.

FIG. 14 shows the diagram of the filtering circuit 13b of signal $y_t$ with the orthogonalizer. The circuits already shown in FIG. 12 carry the same references. The represented circuit comprises a lattice filter 36 with a signal input 360 and N−1 inputs of coefficients 361/1, 361/2 ... 361/N−1 and N outputs 362/1, 362/2 ... 362/N.

The input 130/0 of circuit 13b receives signal $y_t$ and is connected to the input 360 of the lattice circuit 36. The other inputs 131/1 ... 131/N−1 receiving the coefficients $R1_t ... R(N−1)_t$ are connected to inputs 360/1 ... 360/N−1 of circuit 36. The outputs of circuit 36, designated 362/1 ... 362/N supply orthogonal samples $\epsilon1_t ... \epsilon N_t$ and are respectively connected to the first input of multiplication circuits 31/1 ... 32/N, whose second input is connected to the inputs 130/1 ... 130/N of circuit 13b which respectively receive the coefficients $A1_t ... AN_t$. The outputs of circuits 31/1 ... 32/N are connected to the corresponding inputs of adding circuit 34, whose output is the output 132 of circuit 13b and which supplies signal $py_t$.

In the illustrated embodiment, the filter transforming signal $y_t$ into signal $py_t$ coincides with the filter transforming signal $\bar{y}_t$ into signal $p\bar{y}_t$, as described in FIG. 11.

Figure 15:
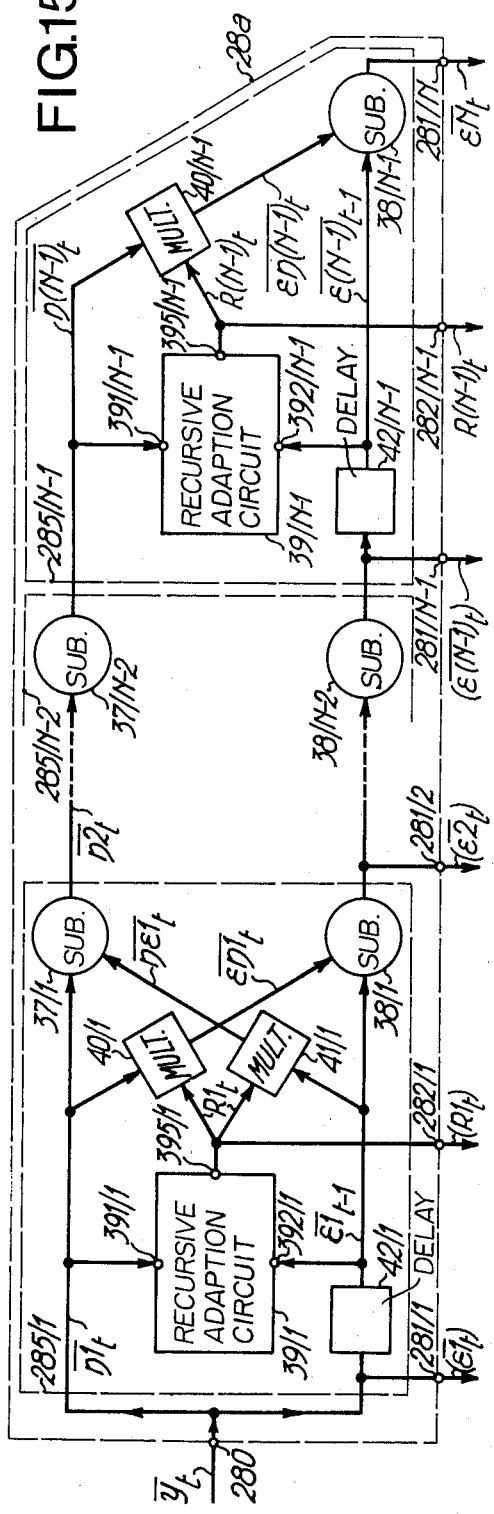
FIG. 15 a block diagram of an adaptive lattice filtering circuit for orthogonalization of the restored signal $\bar{y}_t$.

FIG. 15 shows the diagram of an orthogonalizing circuit 28a using a lattice filter shown in FIG. 11. This circuit comprises N−1 cells 285/1 ... 285/N−1, only the first and last being shown in detail, the N−2 cells being identical to the first cell. The latter comprises two substrates 37/1 and 38/1 with two inputs and one output, a circuit 39/1 for the recursive adaptation of the coefficients having two inputs 391/1 and 392/1 and an output 395/1, two multipliers 40/1 and 41/1 with two inputs and one output and a one-sample delay circuit 42/1.

The final cell 285/N−1 only comprises one subtracter 38/N−1, one multiplier 40/N−1, one delay circuit 42/N−1 and one circuit 39/N−1 for the recursive adaptation of coefficients.

The system of circuit 28a has an input 280, a first group of N outputs 281/1, 281/2 ... 281/N and a second group of N−1 outputs 281/1, 281/2 ... 282/N−1.

The input 280 of circuit 28a receives $\bar{y}_t$, which is respectively applied to output 281/1, which supplies a signal $\bar{\epsilon}1_t$, to the input of delay circuit 42/1, to the first input 391/1 of circuit 39/1 for the recursive adaptation of reflection coefficients and finally to the first input of multiplication circuit 40/1 and at said input 280 the signal is designated $\bar{\eta}1_t$. The output of circuit 42/1 supplies a signal $\bar{\eta}1_{t-1}$, which is applied to the second input of circuit 39/1, to the first input of multiplication circuit 41/1 and to the first input of subtraction circuit 38/1. The output 395/1 of circuit 39/1 supplies a coefficient $R1_t$ which is applied to output 282/1 and to the second input of the two multiplication circuits 40/1 and 41/1, whose respective outputs supply signals $\bar{\epsilon}\bar{\eta}1_t$ and $\bar{\eta}\bar{\epsilon}1_t$, which are respectively applied to the second input of circuits 38/1 and 37/1, whose respective outputs supply signals $\overline{\epsilon 2}_2$ and $\overline{\eta 2}_t$. The output of 38/1 is connected to output 281/2 of the circuit.

The same connections apply, with the corresponding references, up to the outputs exclusively of circuits 37/N−2 and 38/N−2 which supply the signals designated respectively $\overline{\eta(N-1)}_t$ and $\overline{\epsilon(N-1)}_t$. The output of circuit 38/N−2 is connected to the input of circuit 42/N−1, whose output supplies to a signal $\overline{\epsilon(N-1)}_{t-1}$, which is applied to the second input of the circuit 39/N−1 and to the first input of circuit 37/N−1. The output of circuit 37/N−2 supplies a signal $\overline{\eta(N-1)}_t$ which is applied to the first input of circuit 39/N−1 and to the first input of circuit 40/N−1. The output of circuit 39/N−1 supplies a coefficient $R(N-1)_t$ which appears at the output 282/N−1 of circuit 28a and which is applied to the second input of circuit 40/N−1, whose output supplies a signal $\overline{\epsilon\eta(N-1)}_t$, said output being connected to the second input of circuit 38/N−1, whose output supplies a signal $\overline{\epsilon N}_t$ and is an output 281/N of circuit 28a.

In the represented embodiment, circuit 28a is a realisation of an all-zero lattice filter, whose coefficients R1 ... R(N−1) are adjusted in such a way that:

$$\overline{\epsilon(n+1)}_t = \overline{y}_{t-n} - E(\overline{y}_{t-n}/\overline{y}_t\ i \ldots \overline{y}_{t-n+1})$$

in which the expression E(./.) designates a least squares estimate and the oblique bar the function "conditionally to the knowledge of".

Figure 19:
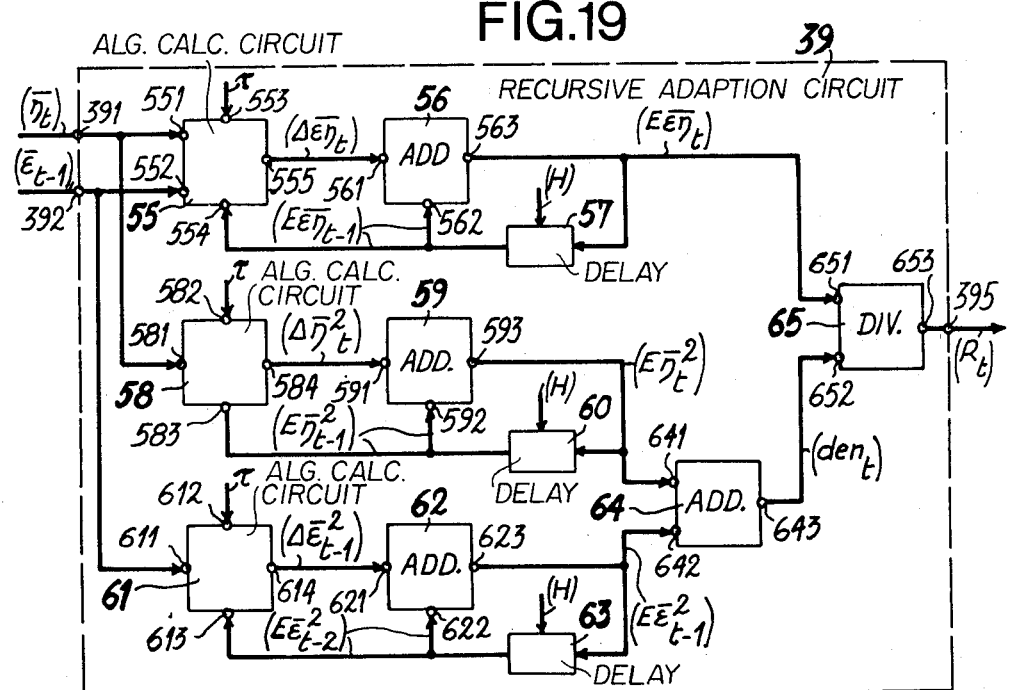
FIG. 19 a block diagram of a conventional circuit for the adaptation of the coefficients of a lattice filter.

An embodiment of the circuits 39/1 ... 39/N−1 is illustrated in FIG. 19.

The cells constituted by circuits 37/n, 38/n, 39/n, 40/n, 41/n can either be realised by different circuits or, if such circuits cannot function in parallel, by the time multiplexing of a single cell, the management of the multiplexing process not being shown in the drawing.

Figure 16:
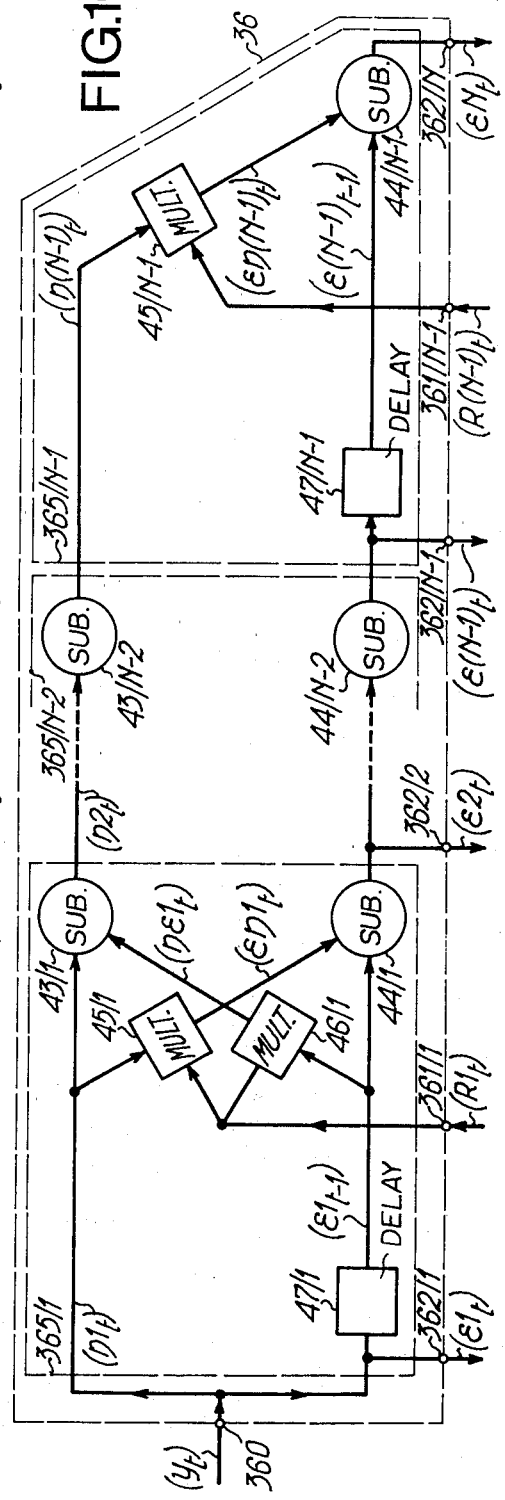
FIG. 16 a block diagram of a lattice filtering circuit of signal $y_t$.

FIG. 16 shows the diagram of an orthogonalizing circuit 36 with reception of the reflection coefficients as introduced in FIG. 14. This circuit is identical to that of FIG. 15, except that it does not comprise reflection coefficient formation circuits because the latter are supplied to it. It comprises N−1 cells 365/1 ... 365/N−1, the N−2 cells being identical to the first cell, the latter comprising two subtracters 43/1 and 44/1, two multipliers 45/1 and 46/1 and a one-sample delay circuit 47/1. The final cell 365/N−1 only comprises a substracter 44/N−1 and a multiplier 45/N−1.

Circuit 36 has a signal input 360, a group of inputs 361/1, 362/2 ... 361/N−1 receiving the N−1 reflection coefficients necessary for filtering and a group of outputs 362/1, 362/2 ... 362/N supplying the orthogonal samples $\epsilon 1_t$, $\epsilon 2_t$ ... $\epsilon N_t$.

The input 360 of the circuit receives signal $y_t$ and is connected to output 362/1 which supplies a signal $\epsilon 1_t$ and to the input of the delay circuit 47/1. The output of this circuit supplies a signal $\epsilon 1_{t-1}$ and is connected to the first input of multiplication circuit 46/1 and to the first input of subtraction circuit 44/1. Input 360 is also connected to the first input of subtraction circuit 43/1 and to the first input of multiplication circuit 45/1, which receive the input signal $\eta 1_t$. The input 361/1 of circuit 36 is connected to the second input of each of the two circuits 45/1 and 46/1, whose outputs supply the signals respectively designated $\epsilon\eta 1_t$ and $\eta\epsilon 1_t$ and are respectively connected to the second input of each of the two circuits 44/1 and 43/1. Circuit 44/1 supplies signal $\epsilon 2_t$, which is applied to the output 362/2 of the circuit. The same connections apply up to circuits 44/N−2 and 43/N−2 exclusively. The output of circuit 44/N−2 supplies a signal $\epsilon(N-1)_y$ applied to the output 36/N−1 of the circuit and is connected to the input of circuit 47/N−1, whose output supplies a signal $\epsilon(N-1)_{t-1}$, which is applied to the first input of subtraction circuit 44/N−1. The output of circuit 43/N−2 supplies a signal $\eta(N-1)_t$ and is connected to the first input of circuit 45/N−1, whose second input is connected to input 361/N−1 receiving $R(N-1)_t$. The output of circuit 45/N−1 supplies a signal $\epsilon\eta(N-1)_t$ and is connected to the second input of circuit 44/N−1, whose output supplies a signal $\epsilon N_t$ applied to the output 362/N of the circuit.

In the illustrated embodiment, circuit 36 constitutes a lattice filter corresponding to the same transfer function as that of the filter obtained by circuit 28a. The comments made in connection with the filter also apply here in connection with the formation of each cell constituted by circuits 43/n, 44/n, 45/n, 46/n.

Figure 17:
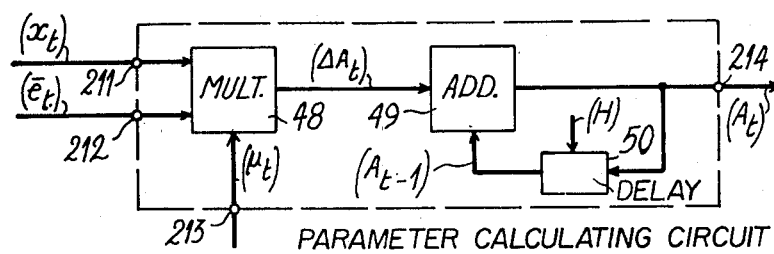
FIG. 17 a block diagram of a conventional recursive adjustment circuit of the parameters of a pole-zero filter.

In exemplified manner, FIG. 17 shows the diagram of a possible embodiment of a random one of the parameter calculating circuits 20/1 ... 20/N, 21/2 ... 32/P in FIGS. 10 and 11.

The represented circuit comprises a multiplier 48 with three inputs and one output, followed by an adder 49 with two inputs and an output relooped onto one of its inputs via a one-sample delay circuit 50. The circuit has three inputs 211, 212 and 213 and one output 214.

The first input 211 receives a signal $x_t$ which is either a signal $\overline{y}_t$ in the case of FIG. 10 or a signal $\overline{\epsilon}_t$ in the case of FIG. 11 or in both cases a delayed signal $\overline{e}_t$. The second input 212 receives signal $\overline{e}_t$. The first two inputs of circuit 48 receive $x_t$ and $\overline{e}_t$ and the third a signal designated $\mu_t$ from the third input 213 of the circuit. The output of circuit 48 supplies a signal $\Delta A_t$. Adder 49 supplies a signal $A_t$ at output 214. Circuit 50 is operated in reading by clock H and its output supplies a delayed signal $A_{t-1}$.

In the embodiment shown, the circuit carries out the calculations $A_t = A_{t-1} + \mu_t x_t \overline{e}_t$, the gain $\mu_t$ either being fixed or calculated by the circuit 26 introduced in FIGS. 10 and 11. Other versions are possible for the calculation of the parameters and are of a known type, like that e.g. affecting the recursion:

$$A_t = A_{t-1} + \mu\ \text{sign}\ (x_t)\ \text{sign}\ (\overline{e}_t)$$

These expressions, to the extent that they make it possible to determine a coefficient of a certain rank from a coefficient of the preceding rank, illustrate the recursive or even sequential character of the calculation of the filtering parameters.

Figure 18:
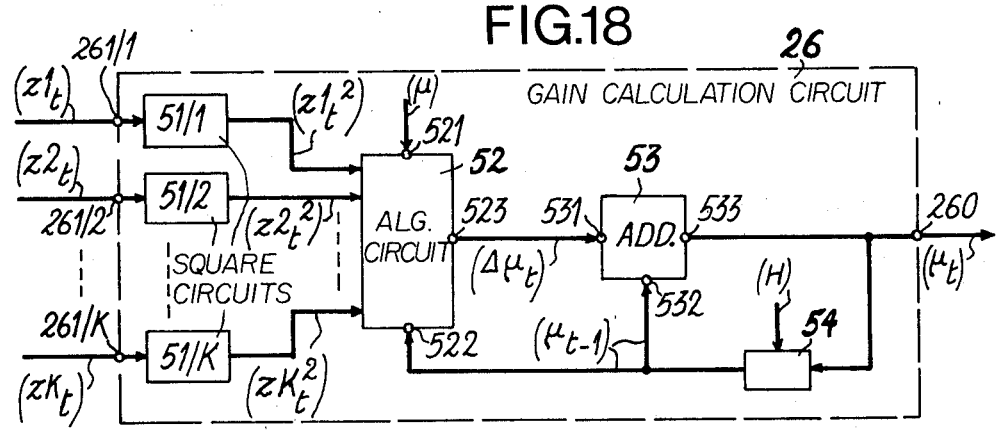
FIG. 18 a block diagram of a conventional gain adaptation circuit of the recursive algorithms used in the preceding circuit.

As an example, FIG. 18 shows the diagram of an embodiment of a gain calculating circuit like that introduced in FIGS. 10 and 11 (circuit 26).

The circuit has K input (K being equal to N+P, cf FIGS. 10 and 11) 261/1, 261/2 ... 261/K and one output 260. It comprises K circuits 51/1, 51/2 ... 51/K for raising to the square, an algebraic circuit 52 with K signal inputs, two control inputs 521,522 and one output 623, an adder 53 with two inputs 531, 532, the first connected to output 523 and to the output 533 and a one-sample delay circuit 54.

The inputs of the circuit receive the signals $z1_t$ ... $zK_t$, which are respectively applied to the circuits 51/1 ... 51/K for raising to the square, whose respective output supplies signal $z1_t^2 -$ ... $ZK_t^2$ applied to the corresponding inputs of the algebraic circuit 52. The input 521 of the latter receives a constant signal $\mu$, and the input 522 a signal $\mu_{t-1}$ from the delay circuit 54 actuated in reading by clock H. The output 523 of circuit 52 supplies a signal $\Delta\mu_t$, which is applied to the first input 531 of adding circuit 53. The second input 523 of this circuit is connected to the output of circuit 54. Output 533 of the adder supplies a signal $\mu_t$, which is applied to the output 260 of circuit 26, as well as to the input of circuit 54.

In the represented embodiment, circuit 52 carries out the calculation:

$$\Delta\mu_t = \mu[z1_t^2 + \ldots + zN_t^2 - \mu_{t-1}]$$

which corresponds in the case of gain calculating circuit 26 to the calculation:

$$\mu_t = \mu_{t-1} - \mu(\mu_{t-1} - \sum_1^N zn_t^2).$$

Finally and still in exemplified manner, FIG. 19 shows the diagram of a possible construction of one of the circuits 39/1 ... 39/N−1 for calculating the reflection coefficients introduced into FIG. 15.

Circuit 39 has two inputs 391, 392 and one output 395 and comprises:
- a first algebraic calculating circuit 55 having four inputs 551, 552, 553, 554 and one output 555, an adder 56 with two inputs 561, 562, the first connected to output 555 and an output 563 relooped onto input 562 across a first delay circuit 57;
- a second algebraic calculating circuit 58 having three inputs 581, 582 and 583 and one output 584, a second adder 59 with two inputs 591, 592, the first connected to output 584 and to an output 593 relooped on input 592 across a second delay circuit 60;
- a third algebraic calculating circuit 61 having three inputs 611, 612, 613 and an output 614, a third adder 62 with two inputs 621, 622, the first connected to output 614 and to an output 623 relooped on input 622 across a third delay circuit 63;
- a fourth adder 64 with two inputs 641, 642, the first connected to output 593 of adder 59 and the second to output 623 of adder 62 and to an output 643;
- a divider 65 with two inputs 651, 652, the first connected to output 563 of adder 56 and the second to output 643 of adder 64 and to an output 653.

In accordance with the notations already used in connection with FIG. 15, the first input 391 of the circuit receives a signal $\bar{\eta}_t$ and the second a signal $\bar{\epsilon}_{t-1}$. These signals are applied to the corresponding inputs 551, 552 of the algebraic calculating circuit 55, whose input 553 receives a signal $\tau$ which is constant and input 554 a signal $\overline{E\epsilon\eta}_{t-1}$ from the output of circuit 57 actuated by H. The output 555 of circuit 55 supplies a signal $\overline{\Delta\epsilon\eta}_t$, which is applied to the first input 561 of adder 56, whose output 563 supplies a signal $\overline{E\epsilon\eta}_t$ which is applied on the one hand to the first input 651 (numerator) of divider 65 and on the other to the input of register 57, whose output supplies the said signal $\overline{E\epsilon\eta}_{t-1}$, applied to the second input 562 of circuit 56.

Input 391 is also connected to the input 581 of the algebraic calculating circuit 58, whose input 582 receives a constant signal $\tau$. The third input 583 receives a signal $E\bar{\eta}_{t-1}^2$ from register 60 actuated by H. Output 584 of circuit 58 supplies a signal $\Delta\bar{\eta}_t^2$, which is applied to the first input 591 of the adder 59, whose output 593 supplies a signal $E\bar{\eta}_t^2$ on the one hand to the first input 641 of adder 64 and on the other to the input of register 60, whose output supplies signal $E\bar{\eta}_{t-1}^2$ applied to the second input 594 of circuit 59. Input 392 is also connected to input 611 of algebraic calculating circuit 61, whose input 612 receives a constant signal $\tau$ and input 613 a signal $E\bar{\epsilon}_{t-2}^2$ from circuit 63 actuated by H. The output 614 of circuit 61 supplies a signal $\Delta\bar{\epsilon}_{t-1}^2$, which is applied to the first input 621 of adder 62, whose output 623 supplies a signal $E\bar{\epsilon}_{t-1}^2$ applied on the one hand to the second input 642 of adder 64 and on the other to the input of register 63, whose output supplies the said signal $E\bar{\epsilon}_{t-2}^2$, applied to the second input 622 of circuit 62. Output 643 of circuit 64 supplies a signal $\text{den}_t$, which is applied to the second input 652 (denominator) of divider 65, whose output 653 supplies a signal $R_t$ applied to the output 395 of the reflection coefficient calculating circuit.

In the illustrated embodiment, circuit 55 performs the calculation:

$$\Delta\epsilon\bar{\eta}_t = \tau(2\bar{\eta}_t\epsilon_{t-1} - E\epsilon\bar{\eta}_{t-1})$$

so that signal $E\epsilon\eta_t$ is a recursive estimator with exponentially decreasing memory of twice the crossed covariance of signals $\bar{\eta}_t$ and $\bar{\epsilon}_{t-1}$. Circuits 58 and 61 respectively perform the calculations:

$$\Delta\bar{\eta}_t^2 = \tau((\bar{\eta}_t)^2 - E\bar{\eta}_{t-1}^2)$$

and $$\Delta\bar{\epsilon}_{t-1}^2 = \tau(\bar{\epsilon}_{t-1}^2 - E\epsilon_{t-2}^2)$$

so that signals $E\bar{\eta}_t^{-2}$ and $E\bar{\epsilon}_{t-1}^{-2}$ are recursive estimators of the respective powers of the outward channel (signal $\eta_t$) and return channel (signal $\bar{\epsilon}_{t-1}$). Finally, $R_t$ is a recursive estimator of the theoretical reflection coefficients equal to:

$$\frac{2E\bar{\eta}_t\bar{\epsilon}_{t-1}}{E\bar{\eta}_t^2 + E\bar{\epsilon}_{t-1}^2}$$

so that the sign E designates the mathematical expectation.

TABLE

| $y_{AR}$ | $y_{MA}$ | Shaping filter | Comments |
|---|---|---|---|
| 0 | 0 | 1 | Conventional ADPCM without shaping. |
| 1 | 1 | $\dfrac{1 + \sum_1^P Bkz^{-k}}{1 - \sum_1^N Akz^{-k}}$ | Shaping by complete parallelism between the spectra of $\Delta y_t$ and $\bar{y}_t$. |

TABLE-continued

| $\gamma_{AR}$ | $\gamma_{MA}$ | Shaping filter | Comments |
|---|---|---|---|
| 0 | 1 | $1 + \sum_{1}^{P} Bk z^{-k}$ | Taking account of zeros of $\bar{y}_t$ for shaping to $\Delta y_t$. |
| 1 | 0 | $\dfrac{1}{1 - \sum_{1}^{N} Ak z^{-k}}$ | Taking account of poles of $\bar{y}_t$ for shaping to $\Delta y_t$. |
| $0 < y < 1$ | $0 < y' < 1$ | $\dfrac{(1 - y') + y'(1 + \sum_{1}^{P} Bk z^{-k})}{(1 - y) + y(1 - \sum_{1}^{N} Ak z^{-k})}$ | Shaping by partly taking account of the poles and zero $\bar{y}_t$. |

What is claimed is:

1. A coding process of the adaptive prediction differential PCM type comprising the steps of: forming an error signal $e_t$ from the difference between a sample of signal $y_t$ to be coded and a prediction signal $\bar{p}_t$ of said signal in which t is a sampling time; quantizing said error signal $\bar{e}_t$; coding the quantized signal; forming a restored error signal $e_t$ from one of said quantized and coded signals; forming a restored signal $\bar{y}_t$ by adding said restored error signal $\bar{e}_t$ to said prediction signal $\bar{p}_t$; and forming said prediction signal $\bar{p}_t$ from said restored signals $\bar{y}_t$ and $\bar{e}_t$ by first and second linear filtering operations; said first operation being performed using N successive samples of $\bar{y}_t$, namely, $\bar{y}_t, \bar{y}_{t-1}, \ldots, \bar{y}_{t-N+1}$, and comprising taking a sequence of N samples from a first sequence formed by said N samples of $\bar{y}_t$ and from a second sequence obtained by orthogonalizing said N samples of $\bar{y}_t$, and multiplying said sequence of N samples respectively by coefficients $A1_t, A2_t, \ldots, AN_t$, then summing the products obtained to obtain a prediction signal $p\bar{y}_t$; said second operation being performed using P successive samples of $\bar{e}_t$, namely, $\bar{e}_t, \bar{e}_{t-1}, \ldots, \bar{e}_{t-P+1}$, and comprising multiplying said P successive samples respectively by coefficients $B1_t, B2_t, \ldots, BP_t$ and summing the products obtained to obtain a prediction signal $p\bar{e}_t$; adjusting sequentially said coefficients $A1_t, A2_t, \ldots, AN_t$ and $B1_t, B2_t, \ldots, BP_t$ at each time t so that the mean power of said error signal $\bar{e}_t$ is minimized; and carrying out at least one of the two following operations (a) and (b):

(a) forming a linear filtering of said signal $y_t$ by using N successive samples of $y_t$, namely, $y_t, y_{t-1}, \ldots, y_{t-N+1}$, and comprising taking a sequence of N samples from a first sequence formed by said N samples of $y_t$ and from a second sequence formed by N derivative samples obtained by orthogonalizing said N samples of $y_t$, and multiplying said sequence of samples by N coefficients equal to the said coefficients $A1_t, A2_t, \ldots, AN_t$, then adding the products obtained to supply a filtered signal $py_t$, then forming on the basis of said signal $py_t$ and said signal $p\bar{y}_t$ previously obtained by the filtering of $\bar{y}_t$, a signal $pAR_t$ equal to $\gamma_{AR} py_t + (1 - \gamma_{AR}) p\bar{y}_t$, in which $\gamma_{AR}$ is a regulatable coefficient between 0 and 1 (terminals included);

(b) filtering the unquantized error signal $e_t$ by multiplying P successive samples of said signal $e_t$, namely, $e_t, e_{t-1}, \ldots, e_{t-P+1}$, by P coefficients equal respectively to said coefficients $B1_t, B2_t, \ldots, BP_t$ and adding the products obtained, to supply a filtered signal $pe_t$, then forming on the basis of said signal $pe_t$ and the signal $p\bar{e}_t$ obtained previously by filtering $\bar{e}_t$ a signal $pMA_t$ which is equal to $\gamma_{MA} pe_t + (1 - \gamma_{MA}) p\bar{e}_t$, in which $\gamma_{MA}$ is a regulatable coefficient between 0 and 1 (terminals included), the coefficients $\gamma_{AR}$ and $\gamma_{MA}$ not being simultaneously zero; and after said operations (a) and (b) adding the signals $pAR_t$ and $pMA_t$, then delaying one sampling time of the sum obtained, to supply said prediction signal $\bar{p}_t$.

2. A process according to claim 1, wherein said orthogonalizing of said N successive samples of $\bar{y}_t$ is performed by means of filtering with $N-1$ coefficients $R1_t, R2_t, \ldots, R(N-1)_t$ recursively by adjusting said $N-1$ coefficients, said filtering supplying N orthogonal samples $\bar{\epsilon}1_t, \bar{\epsilon}2_t, \ldots, \bar{\epsilon}N_t$, which are said derivative samples, then multiplying said derivative samples by said coefficients $A1_t, A2_t, \ldots, AN_t$; and said orthogonalizing of said N successive samples of $y_t$ is performed by means of filtering with $N-1$ coefficients $R1_t, R2_t, \ldots, R(N-1)_t$, said filtering supplying N orthogonal samples $\epsilon1_t, \epsilon2_t, \ldots, \epsilon N_t$ which are said derivative samples, then multiplying said derivative samples by the coefficients $A1_t, A2_t, \ldots, AN_t$.

3. A coding apparatus of the adaptive prediction differential PCM type, comprising a subtractor with two inputs receiving a sample of the signal to be coded $y_t$ and a prediction signal $\bar{p}_t$ in which t is a sampling time and an output supplying an error signal $e_t$, a quantizer of the error signal $e_t$, followed by a coder of the quantized signal, a circuit able to form a restored error signal $\bar{e}_t$ from the quantized or coded signal, an adder with two inputs receiving the restored error signal and the prediction signal $\bar{p}_t$ and with an output supplying a restored signal $\bar{y}_t$ and a predictor receiving the restored signals $\bar{y}_t$ and $\bar{e}_t$ and supplying the said prediction signal $\bar{p}_t$, said predictor comprising two linear filters, the first acting on the restored signal $\bar{y}_t$ and comprising N circuits for the formation of coefficients $A1_t, A2_t, \ldots, AN_t$, a first group of N multipliers with two inputs respectively receiving N successive samples of $\bar{y}_t$ to be filtered, i.e. $\bar{y}_t, \bar{y}_{t-1}, \ldots, \bar{y}_{t-N+1}$ (or derived samples) and said N coefficients and an adder with N inputs connected to N multipliers of the first group and with an output supplying a prediction signal $p\bar{y}_t$, the second comprising P circuits for the formation of P coefficients $B1_t, B2_t, \ldots, BP_t$ and a second group of P multipliers with two inputs respectively receiving the P successive samples of $\bar{e}_t$, i.e. $\bar{e}_t, \bar{e}_{t-1}, \ldots, \bar{e}_{t-P+1}$ and said P coefficients and an adder with P inputs connected to the P multipliers of the second group and with an output supplying a prediction signal $p\bar{e}_t$, said two filters comprising means for sequentially adjusting at each time t the coefficients $A1_t, \ldots, AN_t$ and $B1_t, \ldots, BP_t$ in such a way that the mean power of the error signal $\bar{e}_t$ is minimal, wherein the predictor comprises means for shaping the spectrum of the quantization noise on $y_t$ (i.e. $\Delta y_t = \bar{y}_t - y_t$) by arranging said spectrum in parallel with that of the restored signal $\bar{y}_t$, said means comprising:

(A) at least one of the following circuits:
  (a) a first circuit constituted by a filter of signal $y_t$ comprising a first group of N multipliers with two inputs respectively receiving N successive samples of $y_t$, i.e. $y_t, y_{t-1}, \ldots, y_{t-N+1}$ (or derived samples) and N coefficients respectively equal to said coefficients $A1_t, A2_t, \ldots, AN_t$ sampled in the first filter of the predictor acting on $\bar{y}_t$ and an adding circuit with N inputs connected to the N multipliers of the first group and with an output supplying a filtered signal $py_t$ and by a first algebraic circuit with two inputs, one connected to the output of the filter of $\bar{y}_t$ and receiving the signal $p\bar{y}_t$ and the other connected to the output of the filter of $y_t$ and receiving the signal $py_t$, said first algebraic circuit supplying at one output a signal $pAR_t$ equal to $\gamma_{AR} py_t + (1 - \gamma_{AR}) \bar{p}y_t$, in which $\gamma_{AR}$ is a regulatable coefficient between 0 and 1 (terminals included);
  (b) a second circuit constituted by a filter of the unquantized error signal $e_t$ comprising a second group of P multipliers with two inputs respectively receiving P successive samples of $e_t$, i.e. $e_t, e_{t-1}, \ldots, e_{t-P+1}$ and P coefficients equal then respectively to said coefficients $B1_t, B2_t, \ldots, BP_t$ sampled in the second filter of the predictor acting on $\bar{e}_t$ and an adder with P inputs connected to P multipliers of the second group and with an output supplying a filtered signal $pe_t$ and by a second algebraic circuit with two inputs, one connected to the output of the filter of $\bar{e}_t$ and receiving the signal $p\bar{e}_t$ and the other to the output of the filter of $e_t$ and receiving the signal $pe_t$, said second algebraic circuit supplying at an output a signal $pMA_t$ equal to $\gamma_{MA} pe_t + (1 - \gamma_{MA}) p\bar{e}_t$, in which $\gamma_{MA}$ is a regulatable coefficient between 0 and 1 (terminals included), the coefficients $\gamma_{MA}$ and $\gamma_{AR}$ not being simultaneously zero;

(B) an adder with two inputs connected to the outputs of the first and second algebraic circuits and with an output supplying a signal $pAR_t + pMA_t$;

(C) a circuit with a delay of one sampling period with an input connected to the output of the adder and an output supplying the said prediction signal $\bar{p}_t$.

4. An apparatus according to claim 3, wherein the first filter of the predictor acting on $\bar{y}_t$ is preceded by a first orthogonalizing circuit (28a) of the N successive samples $\bar{y}_t, \bar{y}_{t-1}, \ldots, \bar{y}_{t-N+1}$, said circuit comprising a lattice filter with $N-1$ coefficients $R1_t, R2_t, \ldots, R(N-1)_t$ which are recursively adjusted, said circuit having N outputs (281/1, 281/2 ... 281/N) supplying N orthogonal samples $\bar{\epsilon}1_t, \bar{\epsilon}2_t, \ldots, \bar{\epsilon}N_t$ which constitute the said sample derivatives, which are applied to the inputs of the N multipliers (22/1, 22/2 ... 22/N) of the filter of $\bar{y}_t$, the filter of $y_t$ also being preceded by a second orthogonalizing circuit (36) with a lattice filter which receives N successive samples of $y_t$, namely $y_t, y_{t-1}, \ldots, y_{t-N+1}$ and $N-1$ coefficients $R1_t, R2_t, \ldots, R(N-1)_t$ sampled in the orthogonalizing circuit (28a) of the first filter acting on $\bar{y}_t$, said second circuit having N outputs (362/1, 362/2, ..., 362/N) supplying N orthogonal samples $\epsilon1_t, \epsilon2_t, \ldots, \epsilon N_t$ which constitute the sample derivatives, which are then applied to the inputs of the N multipliers (32/1, 32/2 ... 32/N) of the filter of $y_t$.

* * * * *

UNITED STATES PATENT AND TRADEMARK OFFICE
CERTIFICATE OF CORRECTION

PATENT NO. : 4,385,393

DATED : May 24, 1983

INVENTOR(S) : Christian Chaure, Albert Benveniste and Andre Gilloire

It is certified that error appears in the above—identified patent and that said Letters Patent is hereby corrected as shown below:

Abstract, Line 1, delete "for", insert --of--.

Column 1, line 32, change "quantizer" to --quantized--.

Column 4, line 12, change "descrlbe" to --describe--.

Column 9, line 38, change "$e_t$" to --$\bar{e}_t$--.

Column 9, line 57, change "$y_t$" to --$\bar{y}_t$--.

Column 12, line 24, change "$py_t$" to --$p\bar{y}_t$--.

Column 12, line 41, change "sigal" to --signal--.

Column 12, line 55, change "$y_t$" to --$\bar{y}_t$--.

Column 14, line 64, change "$e1_t$" to --$\bar{e}1_t$--.

Column 16, line 25, delete "31/1" and insert --32/1--.

Column 16, line 28, delete "31/1" and insert --32/1--.

Column 16, line 40, delete "substrates" and insert --subtracters--.

Column 17, line 1, change "$\overline{\epsilon 2_2}$" to --$\overline{\epsilon 2_t}$--.

Column 17, line 8, delete "to".

Column 17, line 10, change "37" to --38--.

Column 17, equation, line 25, delete "i".

Column 17, line 46, change "substracter" to --subtracter--.

Column 17, line 48, change "362/2" to --361/2--.

Column 18, line 2, change "36/N-1" to --362/N-1--.

Column 18, line 56, change "input" to --inputs--.

UNITED STATES PATENT AND TRADEMARK OFFICE
CERTIFICATE OF CORRECTION

PATENT NO. : 4,385,393   Page 2 of 2

DATED : May 24, 1983

INVENTOR(S) : Christian Chaure, Albert Benveniste and Andre Gilloire

It is certified that error appears in the above—identified patent and that said Letters Patent is hereby corrected as shown below:

Column 20, line 33, the equation should read -- $\Delta\ell\bar{\eta}_t = \tau(2\bar{\eta}_t \bar{\epsilon}_{t-1} - E\ell\bar{\eta}_{t-1})$ --.

Column 20, line 35, change "$E\epsilon\eta_t$" to --$E\overline{\epsilon\eta}_t$--.

Column 20, line 44, change "$E\bar{\eta}_t^{-2}$" to --$E\bar{\eta}_t^2$--.

Column 20, line 44, change "$E\bar{\epsilon}_{t-1}^{-2}$" to --$E\bar{\epsilon}_{t-1}^2$--.

Column 20, line 46, put line over "$\eta$".

Column 20, TABLE, change "yAR" and "yMA" to --$\gamma$AR-- and --$\gamma$MA--.

Column 21, line 37, change "$e_{t-1}$" to --$\bar{e}_{t-1}$--,

Column 23, line 22, change "$\bar{p}y_t$" to --$p\bar{y}_t$--.

Column 23, line 35, delete "$\bar{e}_t$" and insert --$e_t$--.

Column 23, line 36, delete "$p\bar{e}_t$" and insert --$pe_t$--.

Column 24, line 1, delete "$e_t$" insert --$\bar{e}_t$-- .

Column 24, line 1, delete "$pe_t$" and insert --$p\bar{e}_t$--.

Column 21, TABLE, change "yAR" and "yMA" to --$\gamma$AR-- and --$\gamma$MA--.

Column 21, TABLE, in first three columns change "y" and "y'" to --$\gamma$-- and --$\gamma'$-- throughout.

*Signed and Sealed this*

*First* Day of *November 1983*

[SEAL]

Attest:

GERALD J. MOSSINGHOFF

*Attesting Officer*   *Commissioner of Patents and Trademarks*